United States Patent
Kawasaki et al.

(10) Patent No.: US 6,555,875 B2
(45) Date of Patent: Apr. 29, 2003

(54) EL DISPLAY DEVICE WITH A TFT

(75) Inventors: Ritsuko Kawasaki, Kanagawa (JP); Kenji Kasahara, Kanagawa (JP); Hisashi Ohtani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/125,499

(22) Filed: Apr. 19, 2002

(65) Prior Publication Data

US 2002/0121665 A1 Sep. 5, 2002

Related U.S. Application Data

(62) Division of application No. 09/696,165, filed on Oct. 26, 2000, now Pat. No. 6,410,368.

(30) Foreign Application Priority Data

Oct. 26, 1999 (JP) .............................. 11-304719

(51) Int. Cl.[7] ..................... H01L 27/10; H01L 27/12; H01L 31/0392
(52) U.S. Cl. ..................................... 257/347
(58) Field of Search ................ 257/347–354; 349/42–48; 438/145, 158, 160, 164, 166, 486, 487, 799

(56) References Cited

U.S. PATENT DOCUMENTS

| | | | |
|---|---|---|---|
| 5,247,190 A | 9/1993 | Friend et al. | |
| 5,264,072 A | 11/1993 | Mukai | |
| 5,399,502 A | 3/1995 | Friend et al. | |
| 5,594,569 A | 1/1997 | Lonua et al. | |
| 5,643,826 A | 7/1997 | Ohtani et al. | |
| 5,817,548 A | 10/1998 | Noguchi et al. | |
| 5,893,730 A | 4/1999 | Yamazaki et al. | |
| 5,923,962 A | 7/1999 | Ohtani et al. | |
| 5,986,306 A | 11/1999 | Nakajima et al. | |
| 6,066,516 A | 5/2000 | Miyasaka | |

FOREIGN PATENT DOCUMENTS

| | | |
|---|---|---|
| JP | WO 90/13148 | 11/1990 |
| JP | 07-130652 | 5/1995 |
| JP | 10-092576 | 4/1998 |

OTHER PUBLICATIONS

U.S. patent application Ser. No. 09/732,724., filed Dec. 11, 2000.

Specifications and Drawings for application Ser. No. 09/640,077, "Semiconductor Device and Method of Fabricating the Same", pp. 1–59, 23 pages of Drawings, Filed on Aug. 17, 2000, Inventors: Ritsuko Kawasaki et al.

Specifications and Drawings for application Ser. No. 09/598,827, "Method of Fabricating a Semiconductor Device", pp. 1–64, 25 pages of drawings, Filed on Jun. 21, 2000, Inventors: Kenji Kasahara.

Specifications and Drawings for application Ser. No. 09/570,612, "Semiconductor Device and Method for its Fabrication", pp. 1–71, 28 pages of drawings, Filed on May 12, 2000, Inventors: Ritsuko Kawasaki et al.

Specifications and Drawings for application Ser. No. 09/732,724, "Semiconductor Device and A Method of Manufacturing the Same", pp. 1–50, 26 pages of Drawings, Filed on Dec. 11, 2000, Inventors: Ritsuko Kawasaki et al.

(List continued on next page.)

*Primary Examiner*—Kamand Cuneo
*Assistant Examiner*—Asok Kumar Sarkar
(74) *Attorney, Agent, or Firm*—Nixon Peabody LLP; Jeffrey L. Costellia

(57) ABSTRACT

A strip-like first insulating layer is formed on a glass substrate, and a second insulating layer is formed on the first insulating layer. Furthermore, an island-like semiconductor layer is formed on the second insulating layer. The island-like semiconductor layer is crystallized by irradiation with laser light through both surfaces of the glass substrate.

58 Claims, 32 Drawing Sheets

OTHER PUBLICATIONS

Ishihara et al., "Location–Controlled Adjacent Grains Following Excimer–Laser Melting of Si Thin–Films", pp. 153–156, 1998, AM–LCD.

Ishihara et al., "Location Control of Large Grain Following Excimer–Laser Melting of Si Thin–Films", pp. 1071–1075, Mar. 1998, Japanese Journal of Applied Physics, vol. 37, pt. 1, No. 3B.

Shimizu et al., "High–Mobility Poly–Si Thin–Film TRansistors Fabricated by a Novel Excimer Laser Crystallization Method", pp. 112–117, 1993, IEEE Transactions on Electron Devices, vol. 40, No. 1.

Schenk et al., "Polymers for Light Emitting Diodes", pp. 33–37, 1999, EuroDisplay 99 Proceedings.

Yoshimoto et al., "Excimer–Laser–Produced and Two–Dimensionally Position–Controlled Giant Si Grains on Organic SOG Underlay", pp. 285–286, Jul. 12–14, 2000, AM–LCD 2000.

Mariucci et al., "Lateral Growth Control in Excimer Laser Crystallized Polysilicon", pp. 137–142, 1999, Thin Solid Films 227.

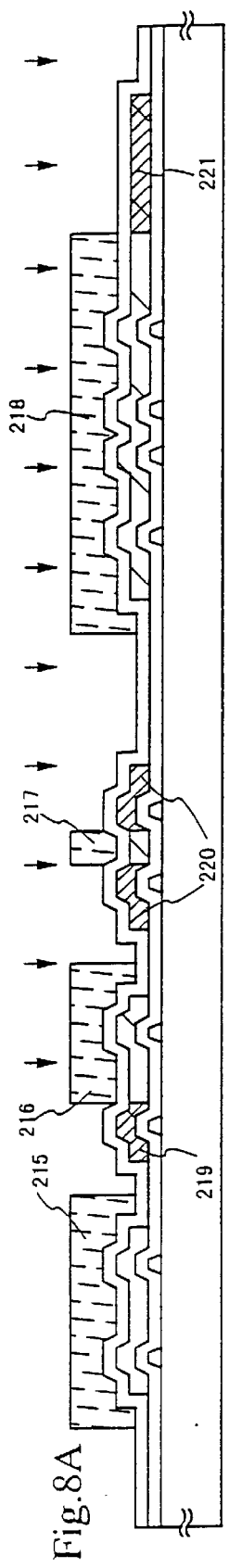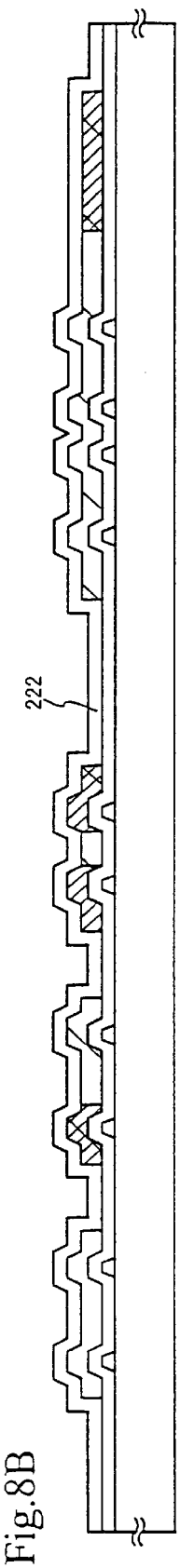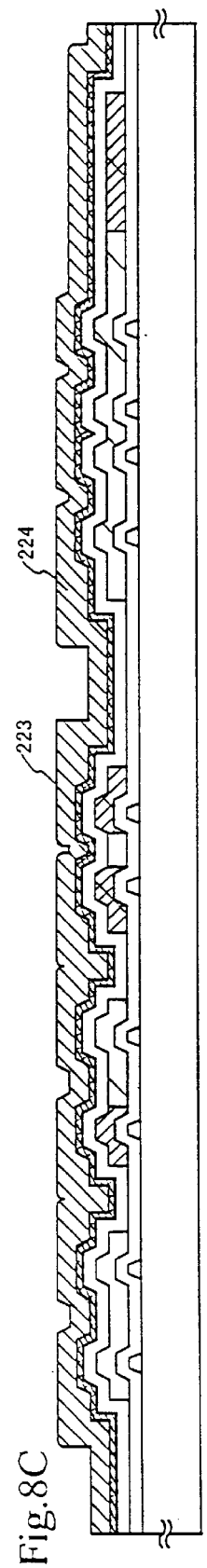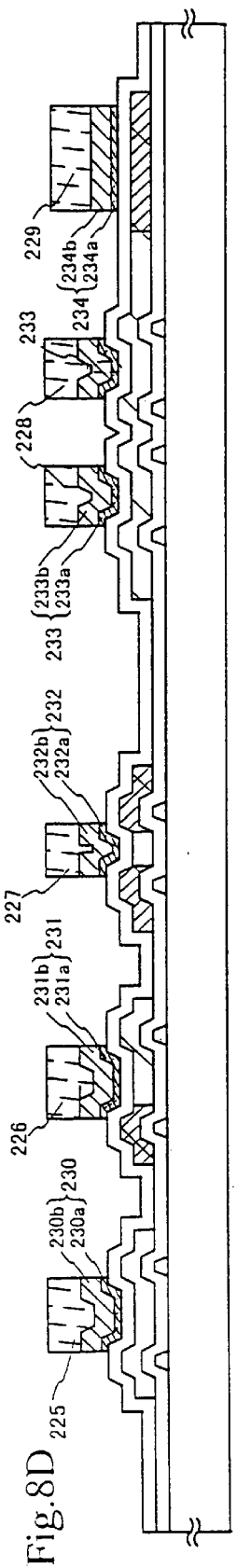

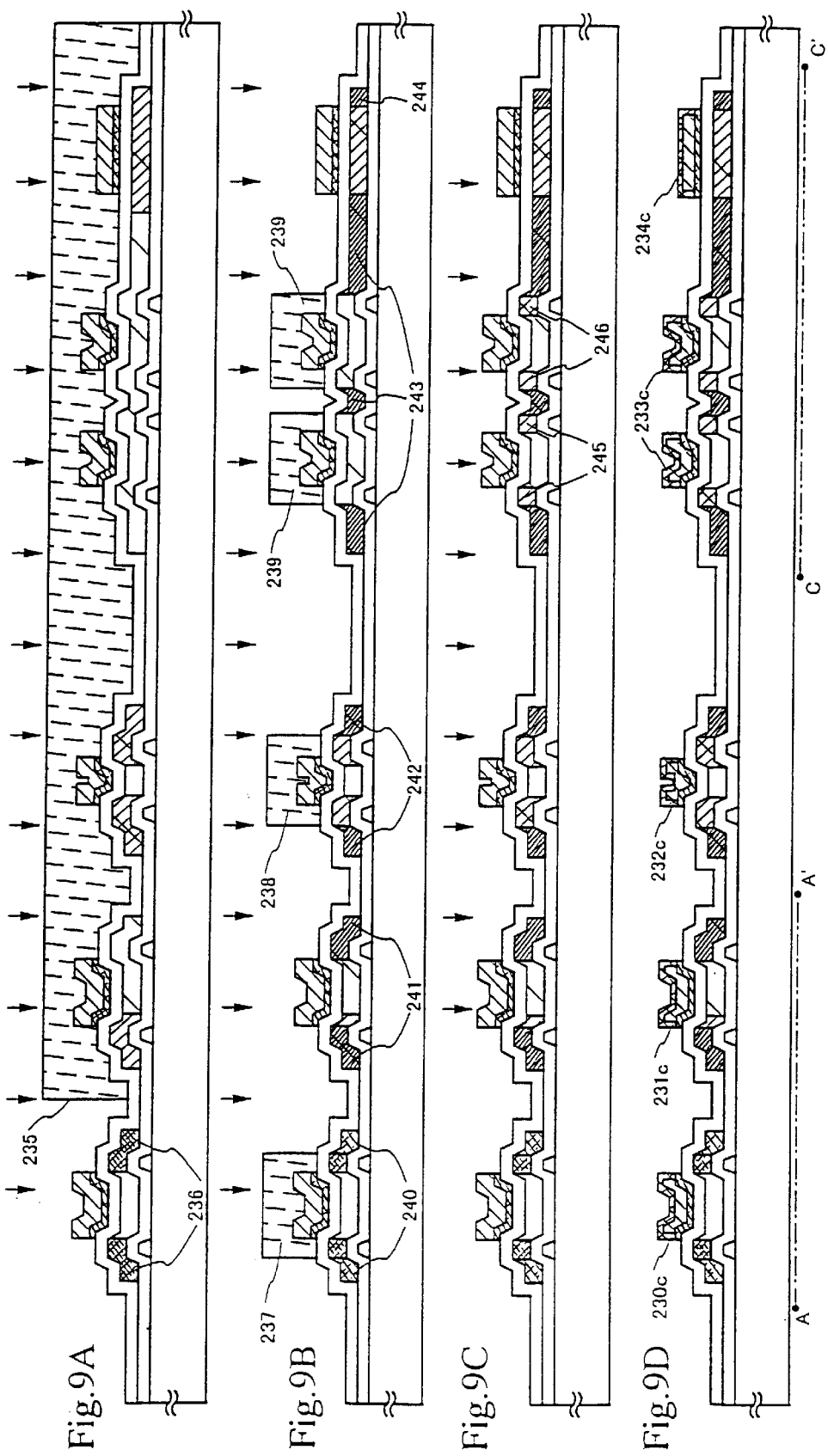

EL DISPLAY DEVICE WITH A TFT

CROSS-REFERENCE TO RELATED APPLICATIONS

This application is a divisional of application Ser. No. 09/696,165, filed Oct. 26, 2000, now U.S. Pat. No. 6,410,368.

BACKGROUND OF THE INVENTION

1. Field of the Invention

The present invention relates to a method of manufacturing a semiconductor film having a crystal structure, formed on a substrate having an insulating surface, and a method of manufacturing a semiconductor device using the semiconductor film as an active layer. In particular, the present invention relates to a method of manufacturing a thin film transistor having an active layer formed of a crystalline semiconductor. In this specification, a semiconductor device generally refers to those capable of functioning by utilizing semiconductor characteristics, and includes an electro-optical device such as an active matrix type liquid crystal display device formed by using a thin film transistor, and electronic equipment provided with such an electro-optical device as a component.

2. Description of the Related Art

A technique has been developed, in which an amorphous semiconductor film is formed on a light-transparent substrate having an insulating surface, and a crystalline semiconductor film obtained by crystallizing the amorphous semiconductor film by laser annealing, thermal annealing, or the like is used as an active layer for a thin film transistor (hereinafter, referred to as a "TFT"). As the light-transparent substrate having an insulating surface, in most cases, a glass substrate made of barium borosilicate glass, aluminoborosilicate glass, or the like is used. Although such a glass substrate has poor heat resistance, compared with a quartz substrate, it is inexpensive. Furthermore, a glass substrate has the advantage of enabling a substrate with a large area to be easily produced.

Laser annealing is known as a crystallization technique that gives high energy only to an amorphous semiconductor film to crystallize it without substantially increasing the temperature of a glass substrate. In particular, an excimer laser that emits light with a short wavelength (400 nm or less) is a representative laser that has been used from the beginning of the development of laser annealing. In recent years, a technique using a YAG laser that is a solid-state laser has also been developed. According to laser annealing using these lasers, a laser beam is formed by an optical system so as to have a spot shape or a linear shape on a surface to be irradiated, and the surface to be irradiated on the substrate is scanned by the resultant laser light (i.e., an irradiation position of laser light is moved relative to the surface to be irradiated). For example, according to excimer laser annealing using linear laser light, the entire surface to be irradiated can be subjected to laser annealing by scanning only in a direction orthogonal to a longitudinal direction, and such laser annealing is excellent in productivity. Therefore, excimer laser annealing is becoming the mainstream in production of a liquid crystal display device using TFTs. This technique realizes a monolithic liquid crystal display device in which TFTs forming a pixel portion (pixel TFTs) and TFTs for a driver circuit provided on the periphery the pixel portion are formed on one glass substrate.

However, a crystalline semiconductor film formed by subjecting an amorphous semiconductor film to laser annealing includes a collection of a plurality of crystal grains, and the position and size of the crystal grains are random. TFTs are formed on a glass substrate by patterning a crystalline semiconductor layer in an island shape for device separation. In this case, the position and size of crystal grains cannot be specified. It is known that an interface of crystal grains (grain boundary) involves factors that cause current transporting characteristics of carriers to be degraded, due to the influence of a recombination center or a trapping center caused by an amorphous structure, a crystal defect, and the like, and the influence of a potential level at a grain boundary. However, it is almost impossible to form a channel formation region, crystal properties of which have a serious effect on the TFT characteristics, using single crystal grains while avoiding the influence of a crystal boundary. Therefore, a TFT using a crystalline silicon film as an active layer has not been obtained, which has characteristics equivalent to those of a MOS transistor formed on a single crystal silicon substrate.

In order to solve such problems, an attempt to grow a large crystal grain has been made. For example, in ["High-Mobility Poly-Si Thin-Film Transistors Fabricated by a Novel Excimer Laser Crystallization Method", K. Shimizu, O. Sugiura, and M. Matumura, IEEE Transactions on Electron Devices vol. 40, No. 1, pp 112–117, 1993], there is a report on a laser annealing method in which a film of three-layer structure of $Si/SiO_2/Si$ is formed on a substrate, and an excimer laser beam is irradiated from both sides of a film side and a substrate side. This report discloses that according to this method, the size of a crystal grain can be enlarged by irradiation of a laser beam at predetermined energy intensity.

The above-mentioned method of Ishihara et al. is characterized in that heat characteristics of an under material of an amorphous silicon film are locally changed and the flow of heat to the substrate is controlled, so that a temperature gradient is caused. However, for that purpose, the three-layer structure of high melting point metal layer/silicon oxide layer/semiconductor film is formed on the glass substrate. Although it is possible to form a top gate type TFT by using the semiconductor film as an active layer in view of structure, since a parasitic capacitance is generated by the silicon oxide film provided between the semiconductor film and the high melting point metal layer, power consumption is increased and it becomes difficult to realize high speed operation of the TFT.

On the other hand, when the high melting point metal layer is made a gate electrode, it is conceivable that the method can be effectively applied to a bottom gate type or reverse stagger type TFT. However, in the foregoing three-layer structure, even if the thickness of the semiconductor film is omitted, with respect to the thickness of the high melting point metal layer and the silicon oxide layer, since the thickness suitable for a crystallizing step is not necessarily coincident with the thickness suitable for the characteristics as a TFT element, it is impossible to simultaneously satisfy both the optimum design in the crystallizing step and the optimum design in the element structure.

Besides, when the opaque high melting point metal layer is formed on the entire surface of the glass substrate, it is impossible to fabricate a transmission type liquid crystal display device. Although the high melting point metal layer is useful in that its thermal conductivity is high, since a chromium (Cr) film or titanium (Ti) film used as the high melting point metal material layer has high internal stress, there is a high possibility that a problem as to adhesiveness to the glass substrate occurs. Further, the influence of the internal stress is also exerted on the semiconductor film formed as the upper layer, and there is a high possibility that the stress functions as force to impart distortion to the formed crystalline semiconductor film.

On the other hand, in order to control a threshold voltage (hereinafter referred to as Vth) as an important characteristic parameter of a TFT within a predetermined range, in addition to valence electron control of the channel formation region, it is necessary to reduce the charged defect density of an under film and a gate insulating film formed of an insulating film to be in close contact with the active layer, or to consider the balance of the internal stress. To such requests, a material containing silicon as its constituent element, such as a silicon oxide film or a silicon nitride oxide film, has been suitable. Thus, there is a fear that the balance is lost by providing the high melting point metal layer to cause the temperature gradient.

SUMMARY OF THE INVENTION

The present invention has been made to solve such problems, and an object of the invention is to realize a TFT capable of operating at high speed by fabricating a crystalline semiconductor film in which the positions and sizes of crystal grains are controlled and further by using the crystalline semiconductor film for a channel formation region of the TFT. Further, another object of the invention is to provide a technique enabling such a TFT to be applied to various semiconductor devices such as a transmission type liquid crystal display device or a display device using electroluminecence material.

Laser annealing is used for forming a crystalline semiconductor layer from an amorphous semiconductor layer formed on a substrate made of glass or the like. According to laser annealing of the present invention, a pulse oscillation type or continuous light-emitting type excimer laser, YAG laser, or argon laser is used as a light source, and laser light formed into a line shape or a rectangular shape by an optical system is irradiated to an island-like semiconductor layer through both front and back surfaces of a substrate with the island-like semiconductor layer formed thereon. In this specification, the front surface of a substrate is defined as the one on which an island-like semiconductor layer is formed, and the back surface of the substrate is defined as the one opposite to the side on which the island-like semiconductor layer is formed.

FIG. 2A shows a structure of a laser annealing apparatus according to the present invention. The laser annealing apparatus includes a laser oscillator 1201, an optical system 1100, and a stage 1202 for fixing a substrate. The stage 1202 is provided with a heater 1203 and a heater controller 1204 and is capable of heating the substrate fixed thereto up to 100° C. to 450° C. A reflective plate 1205 is provided on the stage 1202, and a substrate 1206 is placed on the reflective plate 1205. A method of holding the substrate 1206 in the structure of the laser annealing apparatus shown in FIG. 2A will be described with reference to FIG. 2B. The substrate 1206 held by the stage 1202 is placed in a reaction chamber 1213, and is irradiated with laser light. The reaction chamber 1213 can be put in a state of a reduced pressure or in an atmosphere of inert gas by an exhaust system or a gas system (not shown), and can heat a semiconductor film to 100° C. to 450° C. without contaminating it. The stage 1202 can move in the reaction chamber 1213 along a guide rail 1216, so as to allow the entire surface of the substrate 1206 to be irradiated with linear laser light. Laser light is incident through a quartz window (not shown) provided above the substrate 1206. Furthermore, in FIG. 2B, a transfer chamber 1210, an intermediate chamber 1211, and a load/unload chamber 1212 are connected to the reaction chamber 1213. The intermediate chamber 1211 is separated from the load/unload chamber 1212 by a gate valve 1217, and the reaction chamber 1213 is separated from the transfer chamber 1210 by a gate valve 1218. A cassette 1214 capable of holding a plurality of substrates is placed in the load/unload chamber 1212, and a substrate is transported by a transportation mechanism 1215 provided in the transfer chamber 1210. A substrate 1206' represents a substrate which is being transported. Because of the above-mentioned structure, laser annealing is performed continuously under a reduced pressure or in an atmosphere of inert gas.

FIGS. 3A and 3B illustrate a basic structure of the optical system 1100 in the laser annealing apparatus shown in FIG. 2A. An excimer laser, a YAG laser, an argon laser, or the like is used for a laser oscillator 1101. FIG. 3A is a side view of the optical system 1100. Laser light emitted from the laser oscillator 1101 is split in a vertical direction by a cylindrical lens array 1102. The split laser light is once condensed by a cylindrical lens 1104 and spreads. The laser light is then reflected by a mirror 1107, and formed into linear laser light on an irradiation surface 1109 by a cylindrical lens 1108. Because of this, the energy distribution of linear laser light in a width direction can be made uniform. FIG. 3B is a top view of the optical system 1100. Laser light emitted from the laser oscillator 1101 is split in a lateral direction by the cylindrical lens array 1103. Thereafter, the laser light is combined on the irradiation surface 1109 by the cylindrical lens 1105. Because of this, the energy distribution in a longitudinal direction of the linear laser light can be made uniform.

FIG. 1 illustrates an idea of laser annealing of the present invention. A stripe-like first insulating layer 1002 is formed on a substrate 1001 made of glass or the like. A second insulating layer 1003 is formed on the first insulating layer 1002. Furthermore, an island-like semiconductor layer 1004 is formed on the second insulating layer 1003. As the first and second insulating layers 1002 and 1003, a silicon oxide film, a silicon nitride film, a silicon oxide nitride film, an insulating film mainly containing aluminum, or the like can be used alone or in an appropriate combination.

Laser light that passes through a cylindrical lens 1006 having the same function as that of the cylindrical lens 1108 is irradiated to the island-like semiconductor layer 1004 as linear laser light by the optical system 1100 illustrated in FIGS. 3A and 3B. The laser light irradiated to the island-like semiconductor layer 1004 contains a first laser light component 1007 and a second laser light component 1008. The first laser light component 1007 passes through the cylindrical lens 1006 to be directly irradiated to the island-like semiconductor layer 1004. The second laser light component 1008 passes through the first insulating layer 1002, the second insulating layer 1003 and the substrate 1001, it is reflected by a reflective plate 1005, passes again through the substrate 1001, the first insulating layer 1002, and the second insulating layer 1003, and is irradiated to the island-like semiconductor layer 1004. In any case, the laser light passing through the cylindrical lens 1006 has an incident angle of 45° to 90° with respect to the substrate surface during condensing, so that the laser light reflected by the reflective plate 1005 is also reflected in a direction that leads to the inside of the island-like semiconductor layer 1004. The reflective plate 1005 has a reflective surface made of aluminum (Al), titanium (Ti), titanium nitride (TiN), chromium (Cr), tungsten (W), tungsten nitride (WN), or the like.

In this way, by appropriately selecting a material for the reflective surface, its reflectance can be varied in a range of 20 to 90%, and the intensity of laser light incident trough the back surface of the substrate 1001 can be varied. Furthermore, when the reflective surface is formed into a mirror surface, a regular reflectance of about 90% is obtained in a wavelength range of 240 to 320 nm. Furthermore, when the reflective plate is made of aluminum, and minute unevenness of hundreds of nm is formed on its surface, a diffuse reflectance (integrated reflectance—regular reflectance) of 50 to 70% is obtained.

Thus, laser light is irradiated through both the front and back surfaces of the substrate 1001, and the island-like semiconductor layer 1004 formed on the substrate 1001 is subjected to laser annealing through both surfaces thereof. According to laser annealing, by setting optimum conditions of laser light to be irradiated, a semiconductor layer is instantaneously heated to be melted, to thereby control the generation density of crystal nuclei and crystal growth from the crystal nuclei. The oscillation pulse width of an excimer laser and a YAG laser which emit pulse light is several nsec to tens of nsec (e.g., 30 nsec); therefore, when a semiconductor layer is irradiated with laser light with a pulse oscillation frequency of 30 Hz, it is instantaneously heated, and cooled for a much longer period of time, compared with the heating time.

If only one surface of an island-like semiconductor layer formed on a substrate is irradiated with laser light, a cycle of melting by heating and solidifying by cooling is abrupt. Therefore, even if the generation density of crystal nuclei is controlled, sufficient crystal growth cannot be expected. However, when both surfaces of an island-like semiconductor layer are irradiated with laser light, a cycle of melting by heating and solidifying by cooling is gentle, and a time allowed for crystal growth during solidifying by cooling is relatively long; therefore, sufficient crystal growth can be obtained.

In the above-mentioned transient phenomenon, by providing an island-like semiconductor layer with a temperature distribution to obtain a region where a change in temperature is gentle, so as to control a nucleus generation speed and a nucleus generation density, crystal grains can be made larger. More specifically, as shown in FIG. 1, the stripe-like first insulating layer 1002 is provided on the substrate 1001, and the second insulating layer 1003 is formed on the first insulating layer 1002. The island-like semiconductor layer 1004 is formed on the second insulating layer 1003 so as to cross the first insulating layer 1002. That is, below the island-like semiconductor layer 1004, there are provided a region where the second insulating layer 1003 is formed, and a region where an insulating film consisting of the first insulating layer 1002 and the second insulating layer 1003 is formed. In the latter region, the volume and heat capacity increase; therefore, the maximum temperature attained by irradiation of laser light is lower than that in the former region. As a result, a crystal nucleus is preferentially generated in the latter region, and crystal growth starts in this region. At this time, it is important to irradiate the semiconductor layer through both surfaces thereof with laser light so as to sufficiently heat the semiconductor layer. Thus, a cycle of a change in temperature by irradiation to the island-like semiconductor layer with pulse laser light is rendered gentle, whereby crystal grains can be made larger.

A method of irradiating a substrate having an island-like semiconductor layer formed on its one surface with laser light through the front and back surfaces of the substrate may also be performed as shown in FIG. 4. Light emitted from a laser oscillator 401 such as excimer laser or YAG laser is split by a cylindrical lens array 402 (or 403). The split laser light is once condensed by a cylindrical lens 404 (or 405) and spreads. Thereafter, the laser light is reflected by a mirror 408. A beam splitter 406 is placed in this optical path to divide the optical path into two. The laser light in one of the optical paths is reflected by mirrors 407 and 413. Then, it is formed into linear laser light by a cylindrical lens 414 and irradiated to the front surface of a substrate 418. This laser light is defined as a first laser light. On the front surface of the substrate 418, an underlying film 419 and an island-like semiconductor layer 420 are formed. The laser light in the other optical path is reflected by mirrors 408, 409, and 411. Then, it is formed into linear laser light by a cylindrical lens 412 and irradiated to the back surface of the substrate 418. This laser light is defined as a second laser light. An attenuator 410 is provided in this optical path so as to adjust the intensity of laser light. Even when the substrate is irradiated with laser light through the front and back surfaces in this structure, crystal grains of the semiconductor layer can be made larger in the same manner as described above.

In this specification, laser annealing having the structures as shown in FIGS. 1 and 4 is referred to as dual beam laser annealing, and crystal grains of an island-like semiconductor layer are made larger by adopting this method. By manufacturing a semiconductor device including TFTs having a structure in accordance with the function of each circuit, utilizing the island-like semiconductor layer as an active layer of a TFT, the performance of the semiconductor device is enhanced.

According to the structure of the present invention using dual beam laser annealing, a stripe-like first insulating layer is formed on one surface of a light-transparent substrate, and a second insulating layer is formed on the stripe-like first insulating layer. An island-like semiconductor layer formed on these insulating layers is formed so as to cross the stripe-like first insulating layer. In a preferred embodiment of the present invention, a plurality of stripe-like first insulating layers are formed, an island-like semiconductor layer is formed so as to cross the stripe-like first insulating layers, and a channel forming region of a TFT is formed between a selected stripe-like first insulating layer and its adjacent stripe like first insulating layer.

As described above, according to the structure of the present invention, an island-like semiconductor layer and a stripe-like first insulating layer formed below the island-like semiconductor layer are formed on one surface of a light-transparent substrate, and the stripe-like first insulating layer is provided so as to cross the island-like semiconductor layer. Paired first insulating layers may be formed, and the pair of stripe-like first insulating layers are provided to as to cross the island-like semiconductor layer.

The above-mentioned structure can be preferably applied to a TFT. The above-mentioned region for forming a channel of a TFT formed in the island-like semiconductor layer is formed adjacent to the stripe-like first insulating layer, or the channel formation region is formed between a pair of stripe-like first insulating layers.

Furthermore, a method of manufacturing a semiconductor device of the present invention includes the steps of: forming a stripe-like first insulating layer on one surface of a light-transparent substrate; forming an island-like semiconductor layer over the stripe-like first insulating layer so as to cross it; and irradiating the island-like semiconductor layer with laser light through front and back surfaces of the light-transparent substrate to crystallize the island-like semiconductor layer.

Furthermore, another method of manufacturing a semiconductor device of the present invention includes the steps of forming a pair of stripe-like first insulating layers on one surface of a light-transparent substrate; forming an island-like semiconductor layer over the pair of the stripe-like first insulating layers so as to cross them; and irradiating the island-like semiconductor layer with laser light through front and back surfaces of the light-transparent substrate to crystallize the island-like semiconductor layer.

Thus, the invention described herein makes possible the advantage of providing a TFT capable of being operated at a high speed by manufacturing a crystalline semiconductor layer in which the position and size of crystal grains are controlled, and using the crystalline semiconductor layer for a TFT channel formation region.

BRIEF DESCRIPTION OF THE DRAWINGS

This and other advantages of the present invention will become apparent to those skilled in the art upon reading and understanding the following detailed description with reference to the accompanying drawings, in which:

FIGS. 8A to 8D are cross-sectional views showing the steps of manufacturing a pixel TFT and a TFT for a driver circuit;

FIGS. 9A to 9D are cross-sectional views showing the steps of manufacturing a pixel TFT and a TFT for a driver circuit;

DETAILED DESCRIPTION OF THE PREFERRED EMBODIMENTS

Embodiment Modes of the Invention

Embodiment Mode 1

Figure 1:
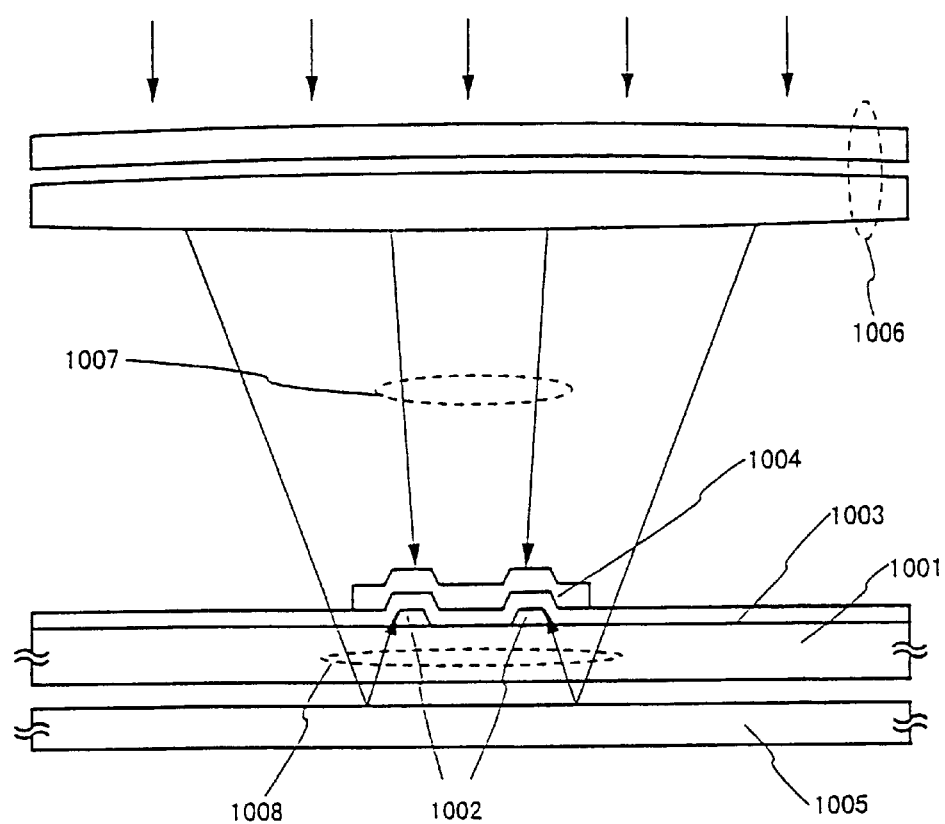
FIG. 1 illustrates an example of dual beam laser annealing according to the present invention.
Figure 2A:
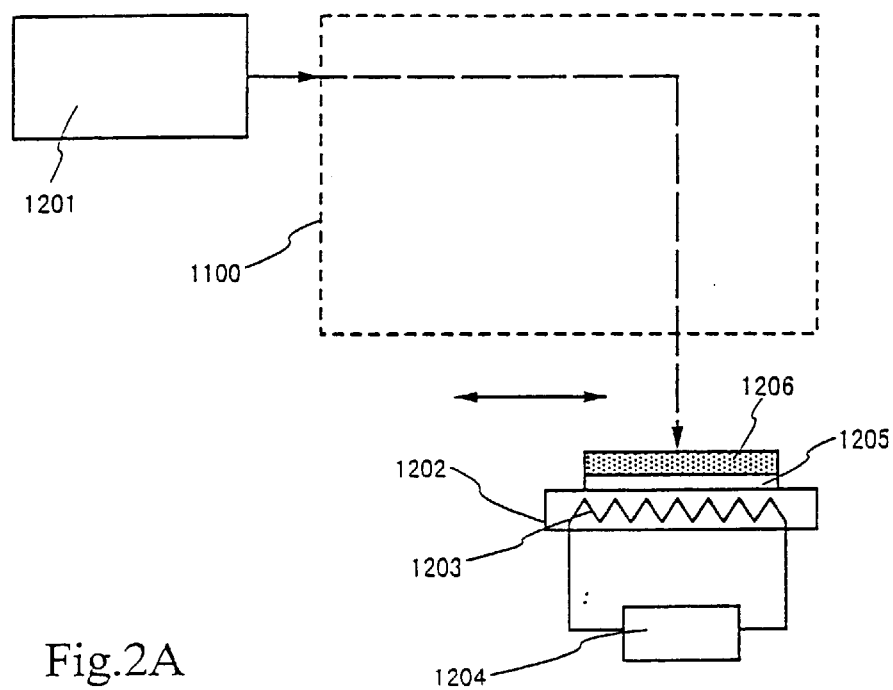
FIGS. 2A and 2B illustrate the structure of a laser annealing apparatus.
Figure 2B:
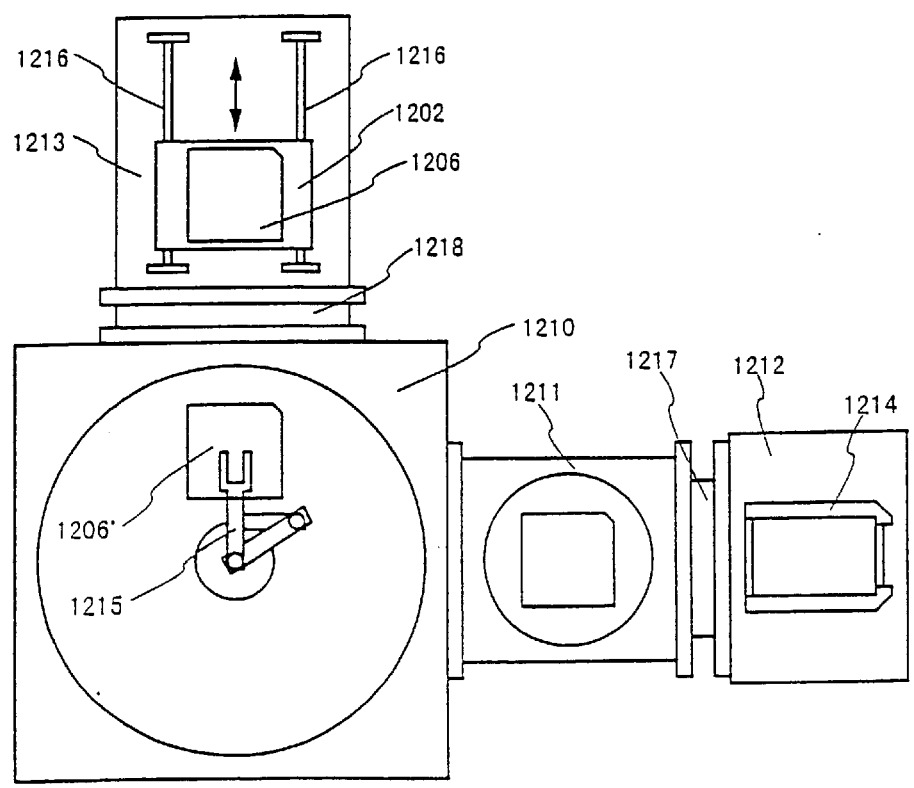
Figure 3A:
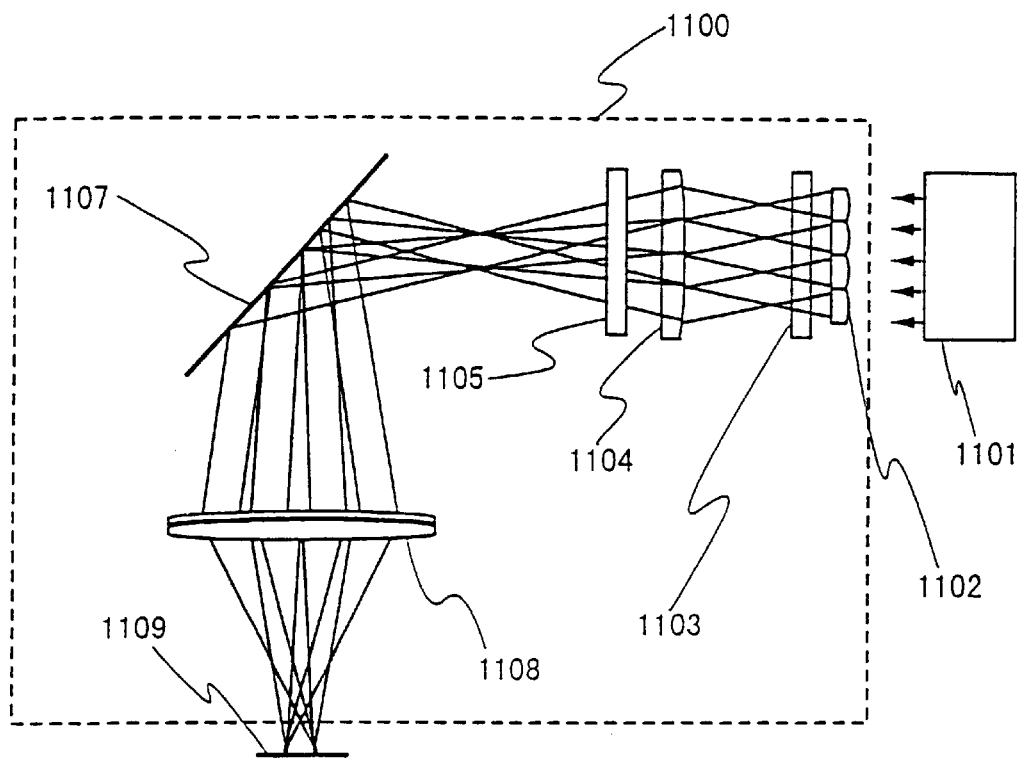
FIGS. 3A and 3B illustrate the structure of an optical system of the laser annealing apparatus.
Figure 3B:
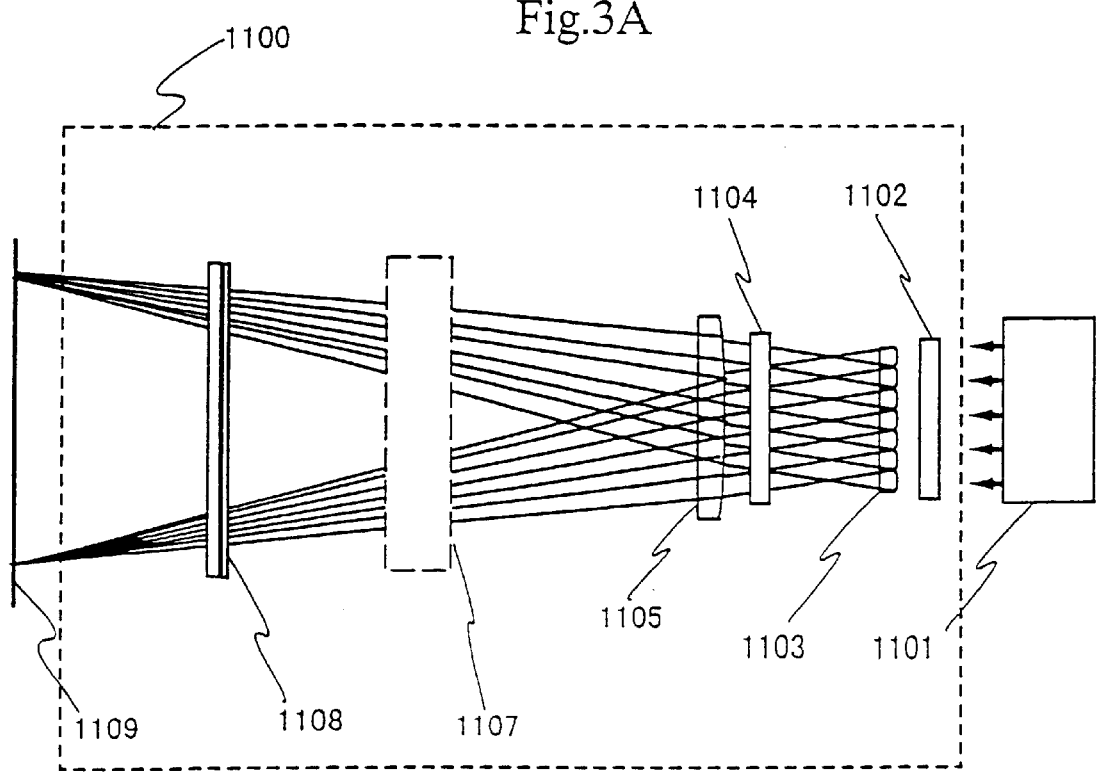
Figure 4:
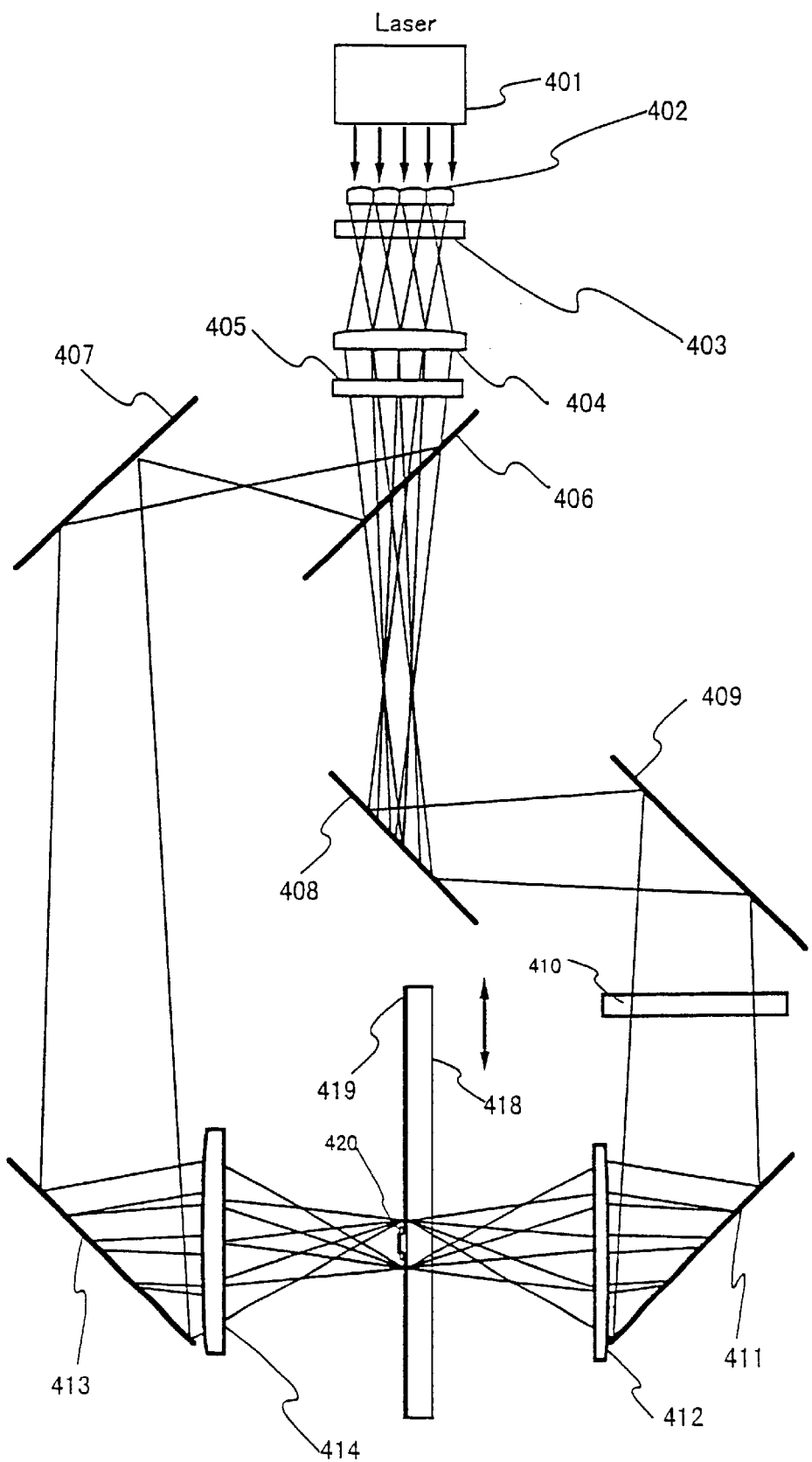
FIG. 4 illustrates the structure of an optical system of the laser annealing apparatus.
Figure 5A:
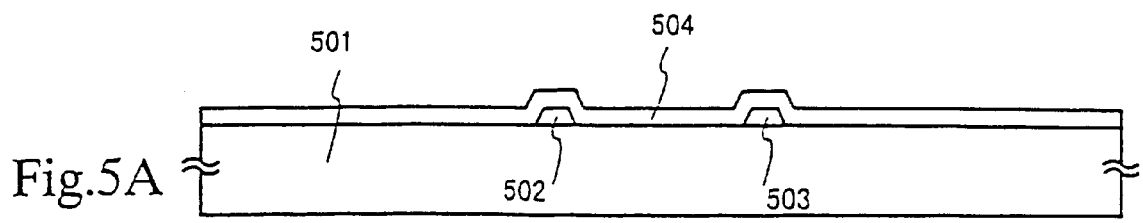
FIGS. 5A to 5C illustrate the steps of crystallization according to the present invention.

The present invention will be described by way of an illustrative embodiment mode with reference to FIGS. 5A to 5C and FIGS. 6A to 6c. In FIG. 5A, a non-alkali glass substrate made of barium borosilicate glass, aluminoborosilicate glass, or the like is used as a substrate 501. For example, #7059 glass, #1737 glass, or the like manufactured by Coming Incorporated can be preferably used.

First insulating layers 502 and 503, which have light transparency and an insulating property, are formed on the surface of the substrate 501 where TFTs are to be formed. The first insulating layers 502 and 503 may be formed of a material excellent in heat conductivity. In this case, it is desirable that the heat conductivity is 10 $Wm^{-1}K^{-1}$ or more. As such a material, an aluminum oxide ($Al_2O_3$) is suitable due to its transparency to visible light and a heat conductivity of 20 $Wm^{-1}K^{-1}$. Furthermore, aluminum oxide is not limited to a stoichiometric ratio, and hence, another element may be added thereto so as to control characteristics such as heat conductivity and an internal stress. For example, nitrogen may be added to aluminum oxide to use aluminum oxide nitride ($AlN_xO_{1-x}$: $0.02 \leq x \leq 0.5$). Alternatively, an aluminum nitride ($AlN_x$) may be used. Furthermore, a compound containing silicon (Si), oxygen (O), nitrogen (N), and M (M is aluminum (Al) or at lest one selected from rare-earth elements) may be used. For example, AlSiON, LaSiON, and the like can preferably be used. In addition, boron nitride can also be used.

The above-mentioned oxide, nitride, and compound can be formed by sputtering, plasma CVD (chemical vapor deposition), or the like. In the case of sputtering, a target having a desired composition and inert gas such as argon (Ar) or nitrogen (N) are used. Furthermore, a thin film diamond layer or a DLC (diamond like carbon) layer having a heat conductivity of 1000 $Wm^{-1}K^{-1}$ may be provided. In any case, the first insulating layers 502 and 503 are formed to a thickness of 50 to 500 nm, preferably 200 nm, using such a material, whereby a temperature increase due to irradiation with laser light can be suppressed. Furthermore, the side walls on the end surfaces of the first insulating layers 502 and 503 are tapered by etching so as to have an angle of 5° to less than 40° with respect to the front surface of the glass substrate 501, whereby step coverage of a film to be formed on the first insulating layers 502 and 503 is ensured.

A second insulating layer 504 is formed by using a silicon oxide film, a silicon nitride film, a silicon oxide nitride film, or the like. The silicon oxide nitride film is formed by plasma CVD, using $SiH_4$ and $N_2O$ as material gas. Oxygen ($O_2$) may be added to the material gas. Although there is no limit to production conditions, when a silicon oxide nitride film is used as the second insulating layer 504, it is formed to a thickness of 50 to 500 nm with an oxygen concentration of 55 atom % to less than 70 atom % and a nitrogen concentration of 1 atom % to less than 20 atom %. In this composition, the internal stress of the silicon oxide nitride film is reduced, and a fixed charge density is reduced. The second insulating layer 504 is not necessarily required; however, it is desirable to provide the second insulating layer 504 for the purpose of preventing diffusion of alkali metal from the substrate 501.

Figure 5B:
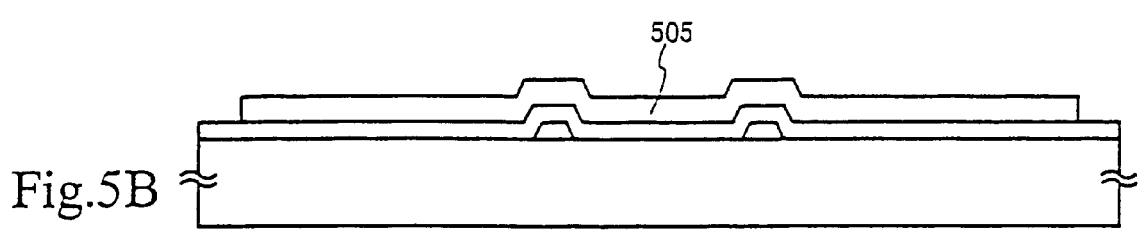
Figure 5C:
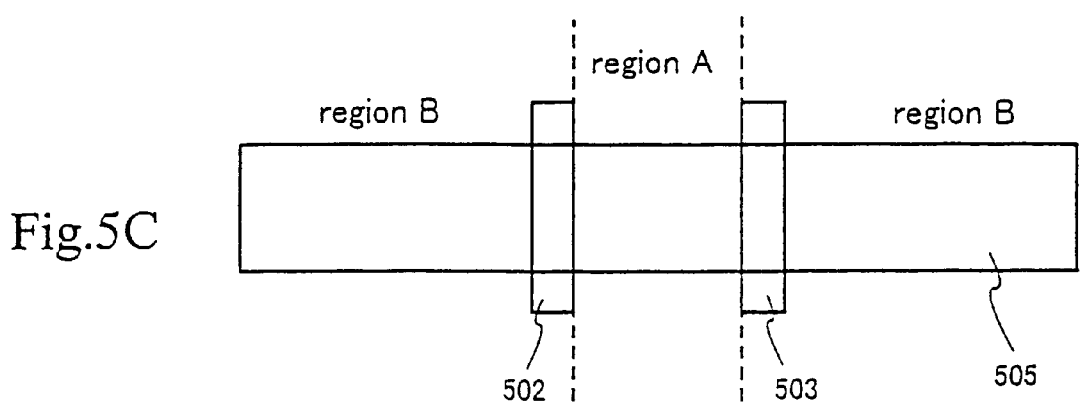

An island-like semiconductor layer 505 shown in FIG. 5B is formed to a thickness of 25 to 80 nm (preferably 30 to 60 nm). The island-like semiconductor layer 505 is obtained by forming a semiconductor film having an amorphous structure by a known method such as plasma CVD or sputtering, followed by removing an unwanted portion by etching. FIG. 5C is a top view of the island-like semiconductor layer 505. The first insulating layers 502 and 503 are patterned to a stripe shape, or a rectangular shape, and disposed so as to cross the island-like semiconductor layer 505 formed above the first insulating layers 502 and 503 without allowing the end portions on short sides to overlap the island-like semiconductor layer 505. Examples of a semiconductor film having an amorphous structure for forming the island-like semiconductor layer 505 include an amorphous semiconductor film and a microcrystalline semiconductor film. A compound semiconductor film having an amorphous structure such as an amorphous silicon germanium film may be used.

Figure 6A:
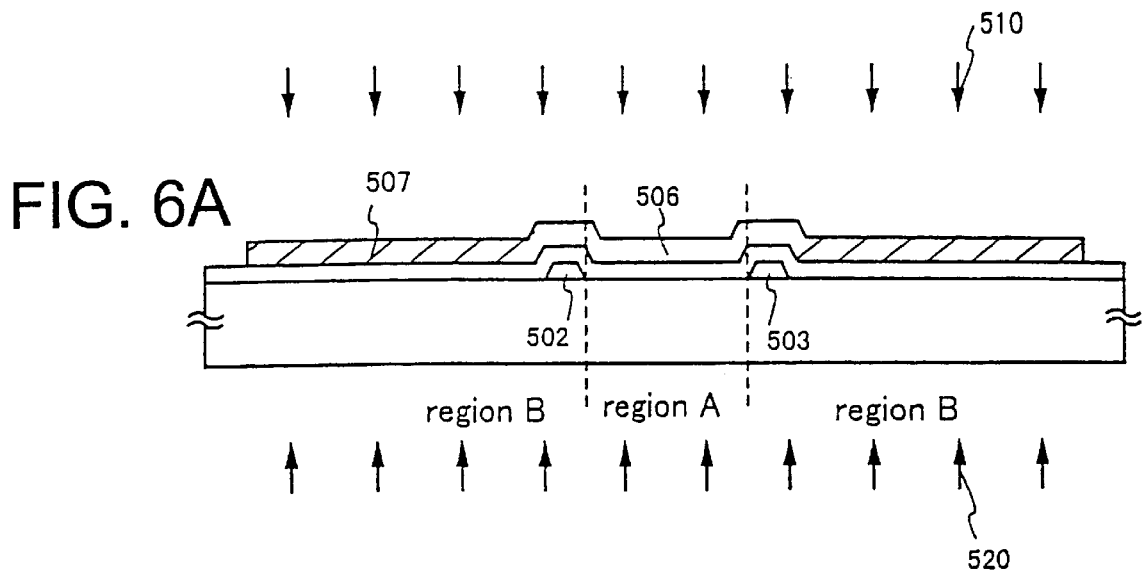
FIGS. 6A to 6C illustrate the steps of crystallization according to the present invention.
Figure 6B:
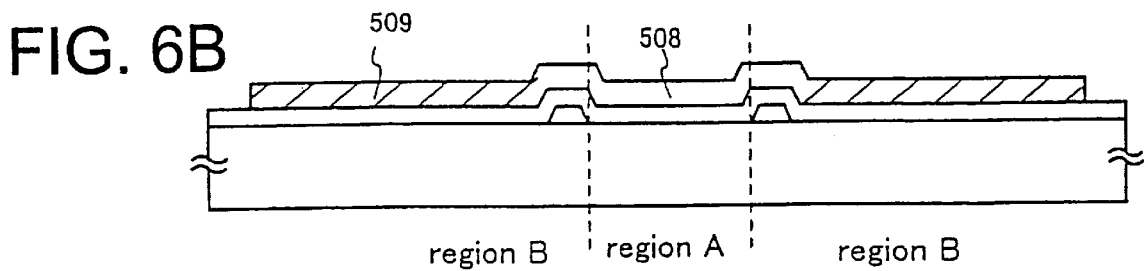
Figure 6C:
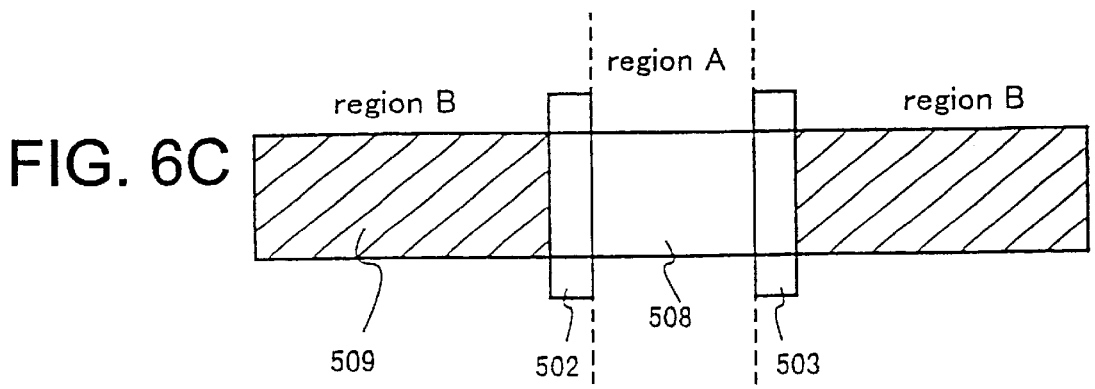

FIGS. 6A to 6C illustrate the steps of crystallization by dual beam laser annealing according to the present invention. Laser annealing is used for crystallization. Rapid thermal annealing (RTA) may also be used. According to RTA, an infrared lamp, a halogen lamp, a metal halide lamp, a xenon arc lamp, or the like is used as a light source. In this case, light emitted from a light source is designed so as to be irradiated to the island-like semiconductor layer through the substrate side surface and the opposite surface thereto. In the step of crystallization, first, it is desirable to allow hydrogen contained in an amorphous semiconductor film to be released; the amorphous semiconductor film is subjected to heat treatment at 400° C. to 500° C. for about one hour to prescribe the amount of hydrogen to be 5 atom % or less.

In the case of crystallization by laser annealing, pulse oscillation type or continuous light-emitting type excimer laser, YAG laser, or argon laser is used as a light source. Laser annealing is conducted as shown in FIGS. 1 to 4.

FIG. 6A shows a state in which the island-like semiconductor layer 505 is irradiated with first laser light 510 and second laser light 520. Reference numeral 506 denotes a region A interposed between the first insulating layers 502 and 503, and 507 denotes the outside region B. In any case, the island-like semiconductor layer 505 is heated by irradiation with laser light, and once melted. It is assumed that crystal nuclei are generated during a cooling step in which the island-like semiconductor layer 505 is shifted from a melt state to a solid state. It is empirically known that a nucleus generation density has a correlation with a temperature in the melt state and a cooling speed, and that a nucleus generation density tends to be high when the island-like semiconductor layer 505 is rapidly cooled from high temperature.

Referring to FIG. 6A, in a portion where the first insulating layers 502 and 503 are formed, the volume and heat capacity increase, so that a temperature increase due to irradiation with laser light can be suppressed. Furthermore, according to dual beam laser annealing, laser light is irradiated to the island-like semiconductor layer 505 from the substrate side surface and the opposite surface thereto; therefore, a cooling speed becomes relatively slow, compared with conventional laser annealing using a single beam. As a result, crystal nuclei are preferentially generated from portions of the island-like semiconductor layer 505 overlapping the first insulating layers 502 and 503, and crystal growth starts therefrom toward the periphery.

As a result, crystal with a large grain size grows on the periphery of the first insulating layers 502 and 503, whereby crystal with a large grain size is obtained in the region A denoted by reference numeral 508, surrounded by the first insulating layers 502 and 503, and crystal with a relatively small grain size is obtained in the region B denoted by reference numeral 509. FIG. 6C is a top view showing the state of crystal growth. The distance between the first insulating layers 502 and 503 in the region A should be about 2 to 6 μm. Furthermore, such an effect becomes conspicuous by increasing the number of repetition pulses of pulse laser light to be irradiated.

Thereafter, the island-like semiconductor layer 505 is subjected to heat treatment at 300° C. to 450° C. in an atmosphere containing 3 to 100% hydrogen or at 200° C. to 450° C. in an atmosphere containing hydrogen generated by plasma, whereby a remaining defect can be neutralized. By manufacturing an active layer of a TFT, using the region A of the island-like semiconductor layer 505 as a channel formation region, the characteristics of the TFT can be enhanced.

Embodiment Mode 2

An island-like semiconductor layer having a crystal structure for use as an active layer of a TFT is formed not only by laser annealing, but also by a combination of laser annealing according to the present invention and thermal annealing. In particular, when crystallization by thermal annealing is applied to crystallization using a catalytic element disclosed in Japanese Patent Application Laid-Open No. Hei 7-130652, crystallization can be realized at 600° C. or less. When the crystalline semiconductor layer thus formed is treated by laser annealing according to the present invention, a crystalline semiconductor layer of high quality can be obtained. Such an embodiment will be described with reference to FIGS. 26A to 26C.

Figure 26A:
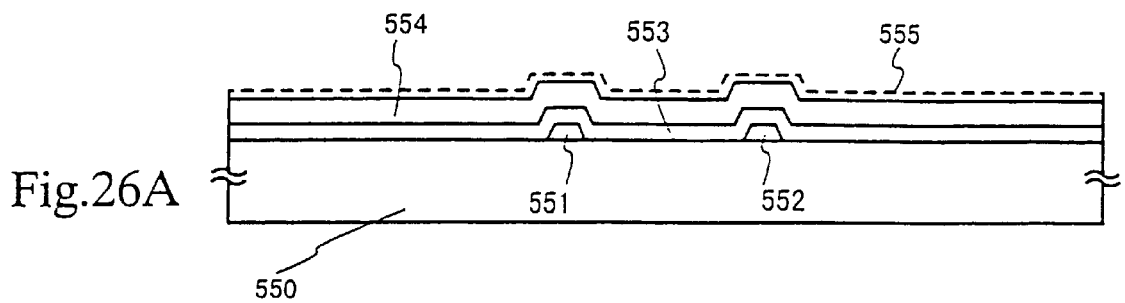
FIGS. 26A to 26C illustrate the steps of crystallization according to the present invention.

In FIG. 26A, a glass substrate shown in Embodiment Mode 1 is preferably used as a substrate 550. First insulating layers 551 and 552, a second insulating layer 553, and an amorphous semiconductor layer 554 are formed in the same way as in Embodiment Mode 1. Then, the amorphous semiconductor layer 554 is coated with an aqueous solution containing a catalytic element (5 to 100 ppm by weight) by spin coating, whereby a layer 555 containing a catalytic element is formed. Alternatively, the layer 555 may be formed by sputtering, vapor deposition, or the like. In this case, the thickness of the layer 555 is prescribed to be 0.5 to 2 nm. Examples of the catalytic element include nickel (Ni), germanium (Ge), iron (Fe), palladium (Pd), tin (Sn), lead (Pb), cobalt (Co), platinum (Pt), copper (Cu), and gold (Au).

Figure 26B:
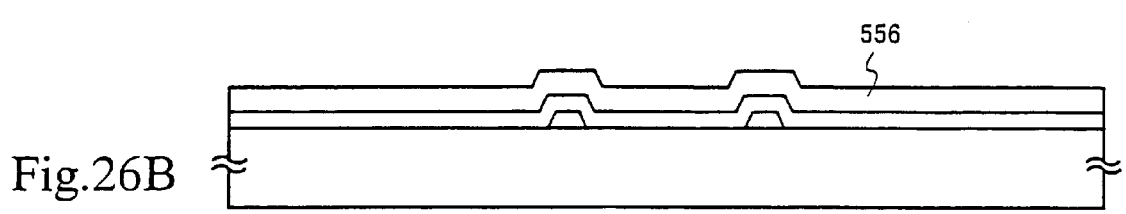

Thereafter, heat treatment is conducted at 400° C. to 500° C. for about one hour, whereby the content of hydrogen in the amorphous semiconductor layer 554 is prescribed to be 5 atom % or less. Then, thermal annealing is conducted at 550° C. to 600° C. for 1 to 8 hours, preferably at 550° C. for 4 hours in a nitrogen atmosphere, using an annealing furnace. Thus, a crystalline semiconductor layer 556 made of a crystalline silicon film can be obtained (FIG. 26B). When the crystalline semiconductor layer 556 formed by thermal annealing is microscopically observed with an optical microscope, locally remaining amorphous regions may be observed. In this case, according to Raman spectroscopy, an amorphous component having a broad peak at 480 $cm^{-1}$ is observed. However, such an amorphous region can be easily removed by dual beam laser annealing according to the present invention, and hence, a crystalline semiconductor layer of good quality can be obtained.

Figure 26C:
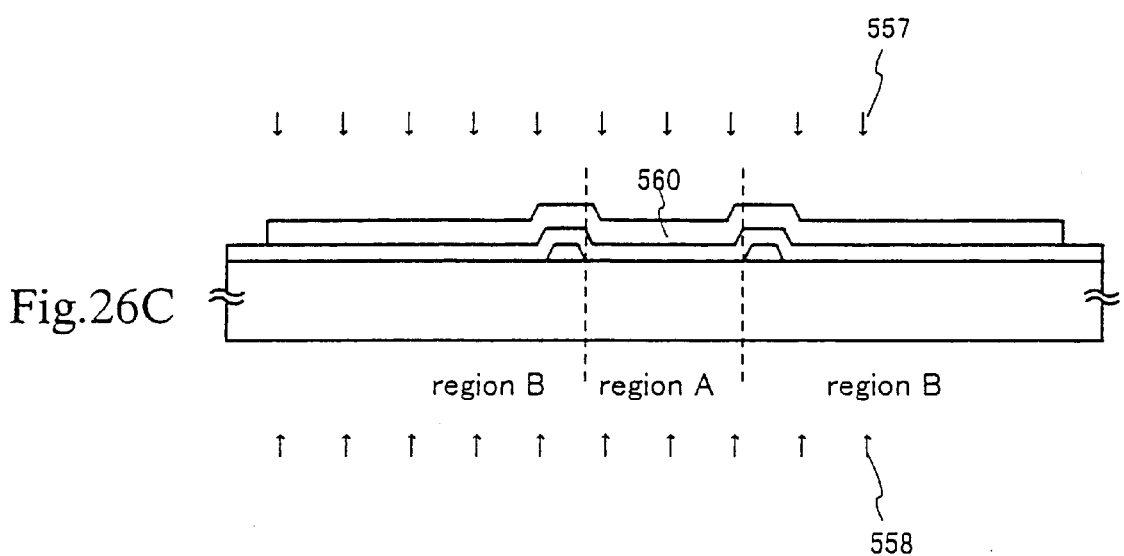

As shown in FIG. 26C, an island-like semiconductor layer 560 is formed from the crystalline semiconductor layer 556. More specifically, as shown in FIG. 26C, dual beam annealing is conducted with respect to the substrate in this state in the same way as in Embodiment Mode 1. As a result, the crystalline semiconductor layer 556 is once melted by first laser light 557 and second laser light 558 to form an island-like semiconductor layer 560 having a crystal structure. In the island-like semiconductor layer 560 thus formed, crystal grains with a grain size equal to or larger than that of the island-like semiconductor layer 508 shown in FIGS. 6A to 6C can be formed mainly in the region A. However, a catalytic element is contained in the island-like semiconductor layer 560 in a concentration of about $1\times10^{17}$ to about $1\times10^{19}$ $atoms/cm^3$.

Embodiment Mode 3

Crystallization of a semiconductor layer by dual beam annealing according to the present invention is characterized in that large crystal grains are grown in the region A as described with reference to FIGS. 5A to 5C, FIGS. 6A to 6C, and FIGS. 26A to 26C. In this embodiment mode, another method of forming a similar crystalline semiconductor layer will be described.

Figure 27A:
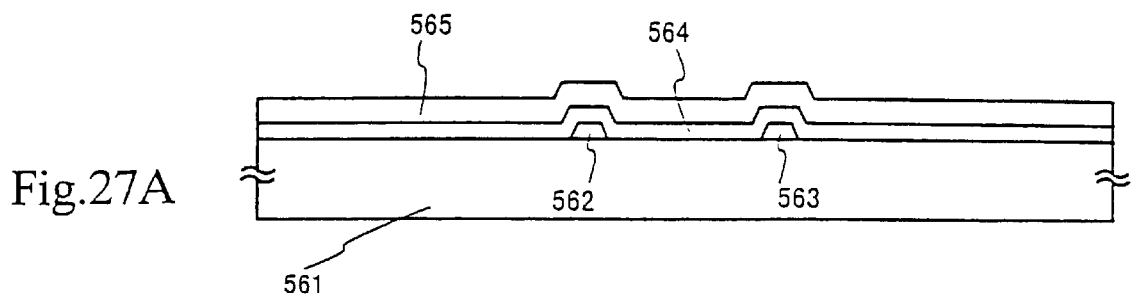
FIGS. 27A to 27C illustrate the steps of crystallization according to the present invention.
Figure 27B:
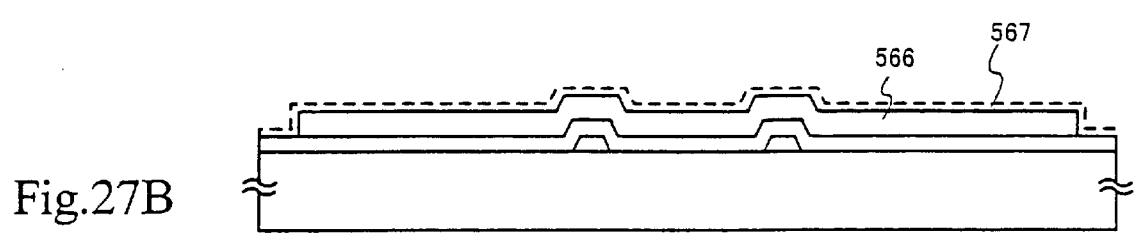

As shown in FIG. 27A, a glass substrate described in Embodiment Mode 1 is preferably used as a substrate 561. Further, insulating layers 562 and 563, a second insulating layer 564, and an amorphous semiconductor layer 565 are formed in the same way as in Embodiment Mode 1. Then, as shown in FIG. 27B, an island-like semiconductor layer 566 is formed from the amorphous semiconductor layer 565. The island-like semiconductor layer 566 is coated with an aqueous solution containing a catalytic element (5 to 100 ppm by weight) by spin coating, to thereby form a layer 567 containing a catalytic element.

Figure 27C:
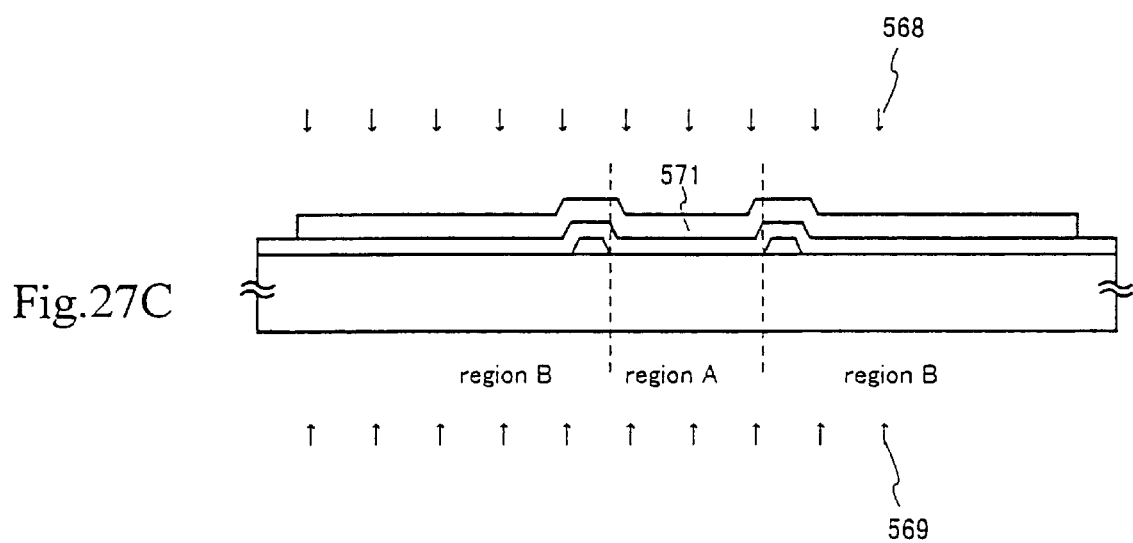

Thereafter, as shown in FIG. 27C, dual beam laser annealing is conducted in the same way as in Embodiment 1. As a result, the island-like semiconductor layer 566 is once melted by first laser light 568 and second laser light 569 to form an island-like semiconductor layer 571 having a crystal structure. In the island-like semiconductor layer 571 thus formed, crystal grains with a large size can be formed mainly in the region A. In this case, a catalytic element is contained in the island-like semiconductor layer 571 in a concentration of about $1\times10^{17}$ to $1\times10^{19}$ $atoms/cm^3$.

Embodiments
[Embodiment 1]

The present invention will be described by way of an embodiment with reference to FIGS. 7A to 11. In this embodiment, a method of simultaneously manufacturing an n-channel TFT (hereinafter, referred to as a "pixel TFT") and a retention capacitor for a pixel portion, and an n-channel TFT and a p-channel TFT for a driver circuit provided on the periphery of the pixel portion will be described in accordance with the steps.

Figure 7A:
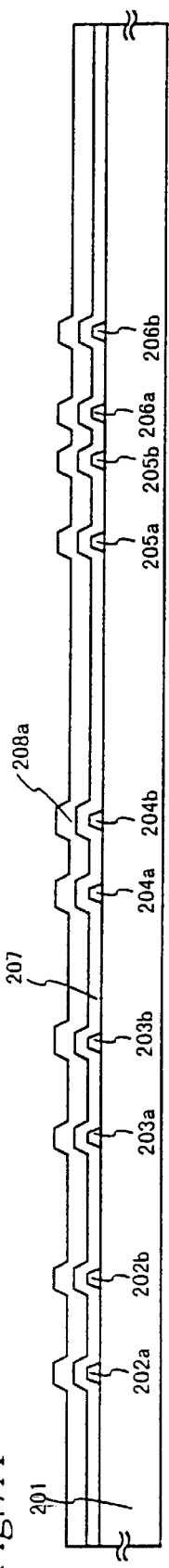
FIGS. 7A to 7D are cross-sectional views showing the steps of manufacturing a pixel TFT and a TFT for a driver circuit.

In FIG. 7A, a barium borosilicate glass, aluminosilicate glass, or the like is used for a substrate 201. In this embodiment, an aluminosilicate glass substrate is used. On the surface of the substrate 201 where TFTs are to be formed, first insulating layers 202 to 206 are formed. The first insulating layers 202 to 206 are formed of a silicon oxide film, a silicon nitride film, a silicon oxide nitride film, or the like.

In the case of using a silicon oxide film, it can be formed by plasma CVD, using a mixture of tetraethyl ortho silicate (TEOS) and oxygen ($O_2$), under the conditions of a reaction pressure of 40 Pa, a substrate temperature of 300° C. to 400° C., and a power density of 0.5 to 0.8 $W/cm^2$ at a high frequency of 13.56 MHZ. In the case of using a silicon oxide nitride film, it can be formed of $SiH_4$, $N_2O$, and $NH_3$, or $SiH_4$ and $N_2O$ by plasma CVD under the conditions of a reaction pressure of 20 to 200 Pa, a substrate temperature of 300° C. to 400° C., a power density of 0.1 to 1.0 $W/cm^2$ at a high frequency of 60 MHZ. Furthermore, a hydrogenated silicon oxide nitride film formed of $SiH_4$, $N_2O$, and $H_2$ may also be used. A silicon nitride film may also be formed of $SiH_4$ and $NH_3$ by plasma CVD.

The first insulating layers 202 to 206 are obtained by forming an insulating film as described above to a thickness of 20 to 200 nm (preferably 30 to 60 nm) over the entire surface of the substrate 201, and forming a resist mask, followed by etching an unwanted portion by photolithography to form a predetermined pattern. Dry etching using fluorine type gas or wet etching using a fluorine type aqueous solution may be used with respect to the insulating film. In the case of selecting the latter method, a mixed solution (LAL 500 manufactured by Stella Chemifa Kabushiki Kaisha) containing 7.13% ammonium bifluoride ($NH_4HF_2$) and 15.4% ammonium fluoride ($NH_4F$) can be used for etching.

A pattern size of the first insulating layers is appropriately determined by those skilled in the art; however, actually, it can be determined considering the size (channel length, channel width) of a TFT to be formed. For example, the first insulating layers 202a and 202b are formed in a stripe shape, or a rectangular shape so as to have a pattern size of 0.5 to 2 μm (preferably 1 μm) with respect to a TFT channel length direction in which the first insulating layers 202a and 202b are formed and 0.2 to 10 μm (preferably 4 to 8 μm) with respect to a channel width direction. Furthermore, the interval between the first insulating layers 202a and 202b is prescribed to be 1 to 10 μm (preferably, 3 to 6 μm). Other first insulating layers shown in FIG. 7A also have the same structure as described above.

Then, a second insulating layer 207 is formed on the first insulating layers 202 to 206. The second insulating layer 207 is formed of a silicon oxide film, a silicon nitride film, a silicon oxide nitride film, or the like so as to have a thickness of 50 to 300 nm (preferably, 100 to 200 nm) in the same way as in the first insulating layers 202 to 206.

Then, a semiconductor layer 208 having an amorphous structure is formed to a thickness of 25 to 80 nm (preferably, 30 to 60 nm) by a known method such as plasma CVD and sputtering. In this embodiment, an amorphous silicon film is formed to a thickness of 55 nm by plasma CVD. Examples of a semiconductor film having an amorphous structure include an amorphous semiconductor film and a microcrystalline semiconductor film. A compound semiconductor film having an amorphous structure such as an amorphous silicon germanium film may be used. Furthermore, since the second insulating layer 207 and the semiconductor layer 208 can be formed by plasma CVD, both layers may be continuously formed under a reduced pressure. In this case, the second insulating layer 207 is not exposed to the atmosphere after being formed, so that its surface can be prevented from contamination, resulting in a decrease in variations of characteristics of TFTs to be formed and a decrease in fluctuation of a threshold voltage.

Figure 7B:
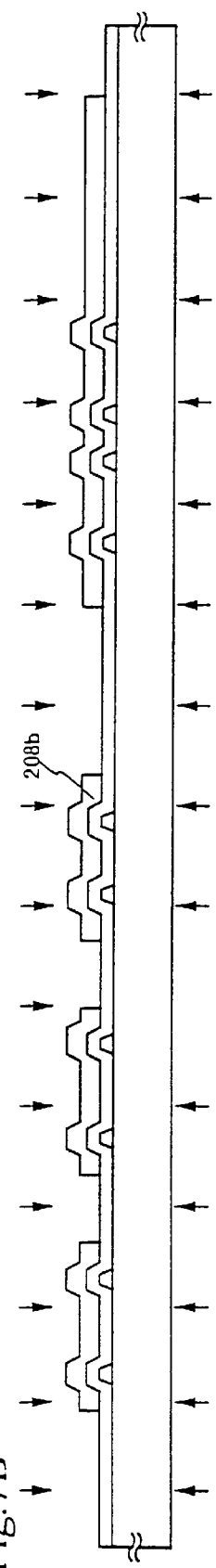

As shown in FIG. 7B, an unwanted portion of the amorphous semiconductor layer 208 is removed by etching to form island-like semiconductor layers 209 to 212. The shape and size of the island-like semiconductor layers 209 to 212 may be appropriately determined by those skilled in the art, and For example, formed in a rectangular shape or a strip shape so that the total size thereof with the first insulating layers 202a and 202b is 0.2 to 20 $\mu$m (preferably 4 to 10 $\mu$m) in a channel length direction and 0.5 to 50 $\mu$m (preferably 4 to 20 $\mu$m) in a channel width direction.

The island-like semiconductor layers 209 to 212 are crystallized by dual beam laser annealing. Any method described in Embodiments 1 to 3 may be applied. For example, irradiation of laser light is conducted by using XeCl excimer laser (wavelength: 308 nm) as a laser light generating apparatus and forming linear laser light by an optical system in the laser annealing apparatus shown in FIGS. 2A to 4, under the conditions of an oscillation frequency of 5 to 50 Hz, an energy density of 100 to 500 mJ/cm$^2$, and an overlapping ratio of linear beam of 80 to 98%. In this manner, the island-like semiconductor layers 209 to 212 are crystallized.

Figure 7C:
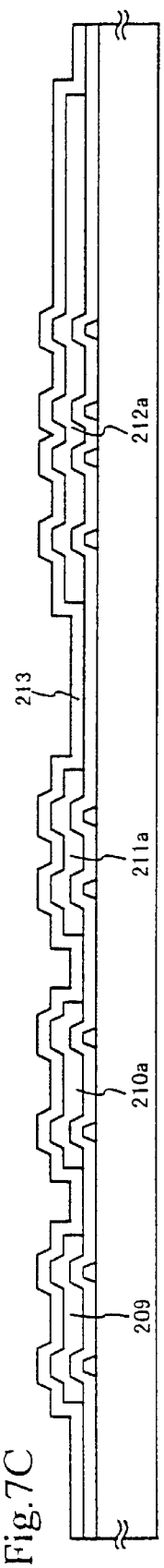

Thereafter, a mask layer 213 of a silicon oxide film having a thickness of 50 to 100 nm is formed by plasma CVD, low pressure CVD, or sputtering. For example, the silicon oxide film is formed by low pressure CVD, using a mixed gas of SiH$_4$ and O$_2$ at 266 Pa and 400° C. (FIG. 7C).

In channel doping, a photoresist mask 214 is provided, and boron (B) is added as a p-type impurity element in a concentration of about 1×10$^{16}$ to about 5×10$^{17}$ atoms/cm$^3$ over the entire surface of the island-like semiconductor layers 210 to 212 on which n-channel TFTs are to be formed. Boron (B) may be added by ion doping or may be added when the amorphous silicon film is formed. Channel doping is conducted for the purpose of controlling a threshold voltage. Channel doping is not a required step for manufacturing a TFT; however, it is preferable to conduct channel doping in order to put a threshold voltage of an n-channel TFT in a predetermined range (FIG. 7D).

In order to form an LDD region of an n-channel TFT for a driver circuit, an n-type impurity element is selectively added to the island-like semiconductor layers 210b and 211b. In this case, photoresist masks 215 to 218 are previously formed. In this step, in order to add phosphorus (P), ion doping is conducted using phosphine (PH$_3$). The concentration of phosphorus (P) in impurity regions (n$^-$) 219 and 220 to be formed is prescribed to be 1×10$^{17}$ to 5×10$^{19}$ atoms/cm$^3$ (FIG. 8A). Furthermore, an impurity region 221 is a semiconductor layer for forming a retention capacitor for a pixel portion. It is recommended that phosphorus (P) should be added to the impurity region 221 in the same concentration as that in the impurity regions 219 and 220 so as to enhance conductivity.

Figure 7D:
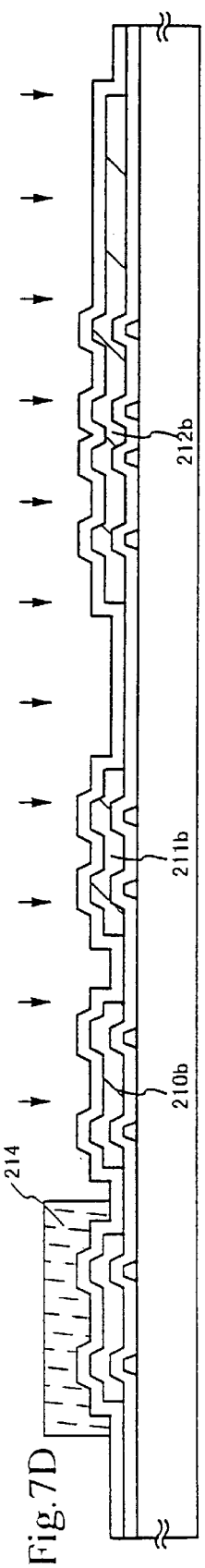

Next, the mask layer 213 is removed by hydrofluoric acid or the like to activate impurity elements added in FIGS. 7D and 8A. Activation can be conducted by thermal annealing or laser annealing at 500° C. to 600° C. for 1 to 4 hours in a nitrogen atmosphere. A combination of thermal annealing and laser annealing may be used. In this embodiment, activation is conducted by using laser. More specifically, the entire surface of the substrate with the island-like semiconductor layers formed thereon is scanned with a linear light beam formed from KrF excimer laser light (wavelength: 248 nm) under the conditions of an oscillation frequency of 5 to 50 Hz, an energy density of 100 to 500 mJ/cm$^2$, and a linear beam overlapping ratio of 80 to 98%. Irradiation conditions of laser light are not particularly limited, and can be appropriately determined by those skilled in the art.

A gate insulating film 222 is formed of an insulating film containing silicon with a thickness of 40 to 150 nm by plasma CVD or sputtering. For example, the gate insulating film 222 is formed of a silicon oxide nitride film formed by plasma CVD using SiH$_4$, N$_2$O, and O$_2$ (FIG. 8B).

Next, a first conductive layer for forming a gate electrode is formed. The first conductive layer may be formed as a single layer. If required, the first conductive layer may have a layered structure of two layers or three layers. In this embodiment, the first conductive layer has a layered structure of a conductive layer (A) 223 made of a conductive metal nitride film and a conductive layer (B) 224 made of a metal film. The conductive layer (B) 224 can be formed of an element selected from the group consisting of tantalum (Ta), titanium (Ti), molybdenum (Mo), and tungsten (W); an alloy mainly containing these elements; or an alloy film containing a combination of the elements (e.g., Mo-W alloy film, Mo-Ta alloy film). The conductive layer (A) 223 is formed of tantalum nitride (TaN), tungsten nitride (WN), titanium nitride (TiN), molybdenum nitride (MoN), or the like. Furthermore, the conductive layer (A) 223 may be formed of tungsten silicide, titanium silicide, molybdenum silicide, or the like. The concentration of impurities in the conductive layer (B) 224 should be reduced so as to decrease resistance. In particular, the concentration of oxygen should be 30 ppm or less. For example, tungsten (W) can exhibit a specific resistance of 20 $\mu\Omega$cm or less by prescribing the oxygen concentration to be 30 ppm or less.

The thickness of the conductive layer (A) 223 is prescribed to be 10 to 50 nm (preferably 20 to 30 nm), and that of the conductive layer (B) 224 is prescribed to be 200 to 400 nm (preferably 250 to 350 nm). In this embodiment, a TaN film with a thickness of 30 nm and a Ta film with a thickness of 350 nm are formed as the conductive layer (A) 223 and the conductive layer (B) 224, respectively, by sputtering. The TaN film is formed by using a mixed gas of argon (Ar) and nitrogen (N) as sputtering gas and using Ta as a target. The Ta film is formed by using argon (Ar) as sputtering gas. Furthermore, when an appropriate amount of Xe or Kr is added to the sputtering gas, an internal stress of a film to be formed is relaxed to prevent the film from peeling. A Ta film in an α-phase has a resistance of about 20 $\mu\Omega$cm, so that it can be used for a gate electrode; however, a Ta film in a β-phase has a resistance of about 180 $\mu\Omega$cm, so that it is not suitable for a gate electrode. A TaN film has a crystal structure close to an α-phase. Therefore, if a Ta film is formed on the TaN film, a Ta film in an α-phase can be easily obtained. Although not shown, it is effective to form a silicon film doped with phosphorus (P) with a thickness of about 2 to about 20 nm under the conductive layer (A) 223. Because of this, the adhesiveness of the conductive film to be formed on the silicon film is enhanced and oxidation is prevented. Furthermore, an alkali metal element contained in a trace amount in the conductive layer (A) 223 or the conductive layer (B) can be prevented from being diffused to the gate insulating film 222. In any case, the resistance of the conductive layer (B) 224 is preferably set in a range of 10 to 500 μΩcm.

Next, photoresist masks 225 to 229 are formed, and the conductive layer (A) 223 and the conductive layer (B) 224 are etched together to form gate electrodes 230 to 233. In this case, for example, dry etching is performed using a mixed gas of $CF_4$ and $O_2$ or $Cl_2$ at a reaction pressure of 1 to 20 Pa. The gate electrodes 230 to 233 are formed of a combination of the conductive layer (A) 230a to 233a and the conductive layer (B) 230b to 233b. At this time, the gate electrodes 231 and 232 provided in an n-channel TFT Fare formed so as to partially overlap the impurity regions 219 and 220 (FIG. 8D). Furthermore, the gate electrodes 230 to 233 may be formed only of the conductive layer (B). Reference numeral 234 denotes retention capacitor line (FIG. 8D).

Next, in order to form a source region and a drain region of a p-channel TFT for a driver circuit, a p-type impurity element is added. Herein, an impurity region is self-aligned, using the gate electrode 230 as a mask. A region where n-channel TFTs are formed is covered with a photoresist mask 235. Then, an impurity region(p+) 236 is formed in a concentration of $1\times10^{21}$ atoms/cm$^3$, using diborane ($B_2H_6$) by ion doping (FIG. 9A).

Next, in an n-channel TFT, an impurity region that functions as a source region or a drain region is formed. Resist masks 237 to 239 are formed, and an n-type impurity element is added to form impurity regions 241 to 244. Ion doping using phosphine ($PH_3$) is conducted, and the concentration of phosphorus (P) in the impurity regions (n+) 241 to 244 is prescribed to be $5\times10^{20}$ atoms/cm$^3$ (FIG. 9B). The impurity region 240 contains boron (B) added in the previous step; however, phosphorus (P) is added to this region merely in a concentration of ½ to ⅓ of that of boron, so that the influence of the added phosphorus (P) is not required to be considered, and the characteristics of a TFT will not be influenced.

In order to form an LDD region of an n-channel TFT for a pixel portion, an n-type impurity element is added. Herein, an n-type impurity element is added by ion doping so as to be self-aligned using the gate electrode 233 as a mask. The concentration of phosphorus (P) to be added is prescribed to be $5\times10^{16}$ atoms/cm$^3$, which is lower than that of the impurity elements added in FIGS. 8A, 9A, and 9B, so that only impurity regions (n−) 245 and 246 are actually formed (FIG. 9C).

Thereafter, heat treatment is conducted in order to activate the n-type or p-type impurity elements added in the respective concentrations. Heat treatment can be conducted by thermal annealing using an annealing furnace, laser annealing, or rapid thermal annealing (RTA). In this embodiment, activation is conducted by thermal annealing using an annealing furnace. Heat treatment is conducted at 400° C. to 700° C., typically 500° C. to 600° C. in a nitrogen atmosphere with an oxygen concentration of 1 ppm or less, preferably 0.1 ppm or less. In this embodiment, heat treatment is conducted at 550° C. for 4 hours.

In the above-mentioned thermal annealing, conductive layers (C) 230c to 234c made of TaN are formed to a thickness of 5 to 80 nm on the conductive layers (B) (Ta films) 230b to 234b forming the gate electrodes 230 to 233 and the retention capacitor line 234. Furthermore, in the case where the conductive layers (B) 230b to 234b are made of tungsten (W), tungsten nitride (WN) layers are formed thereon. In the case where the conductive layers (B) 230b to 234b are made of titanium (Ti), titanium nitride (TiN) are formed thereon. Furthermore, even when the gate electrodes 230 to 234 are exposed to a nitrogen-containing plasma atmosphere using nitrogen, ammonia, or the like, similar layers can be formed thereon. Then, thermal annealing is conducted at 300° C. to 450° C. for 1 to 12 hours in an atmosphere containing 3 to 100% hydrogen to hydrogenate the island shaped semiconductor layer. In this step, a dangling bond of $10^{16}$ to $10^{18}$/cm$^3$ in the island-like semiconductor layer is terminated by thermally excited hydrogen. As another means for hydrogenation, plasma hydrogenation (using hydrogen excited by plasma) may be conducted.

If a catalytic element promoting crystallization of silicon is used in the crystallization step, and thereafter, a gettering step is not conducted, a trace amount (about $1\times10^{17}$ to about $1\times10^{19}$ atoms/cm$^3$) of catalytic element remains in the island-like semiconductor layer. Needless to say, TFTs can be completed even in such a state; however, it is more preferable to remove the remaining catalytic element at least from a channel formation region. One of methods for removing the catalytic element is to utilize a gettering function of phosphorus (P). The concentration of phosphorus (P) required for gettering may be the same as that of the impurity region (N+) formed in FIG. 9B. Due to thermal annealing in the activation step, the catalytic element can be segregated from the channel formation region of an n-channel TFT and a p-channel TFT to the impurity regions 240 to 244. As a result, the catalytic element in a concentration of about $1\times10^{17}$ to about $1\times10^{19}$ atoms/cm$^3$ can be segregated to the impurity regions 240 to 244 (FIG. 9D).

Figure 12A:
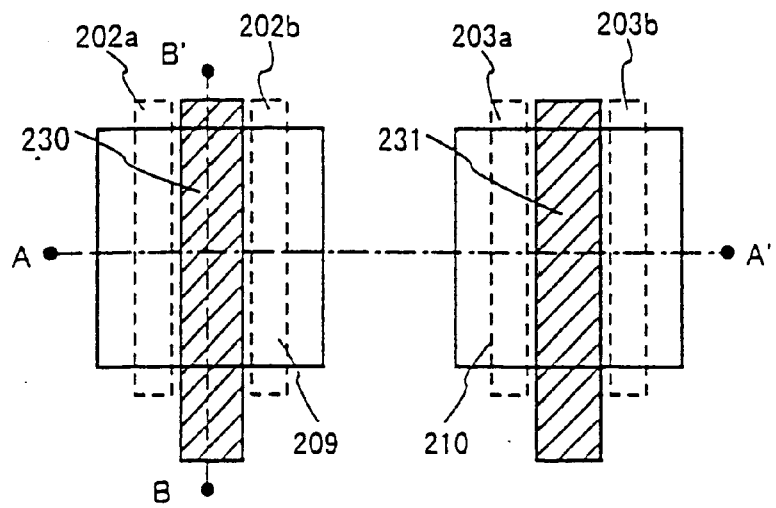
FIGS. 12A to 12C are top views showing the steps of manufacturing a TFT for a driver circuit.
Figure 13A:
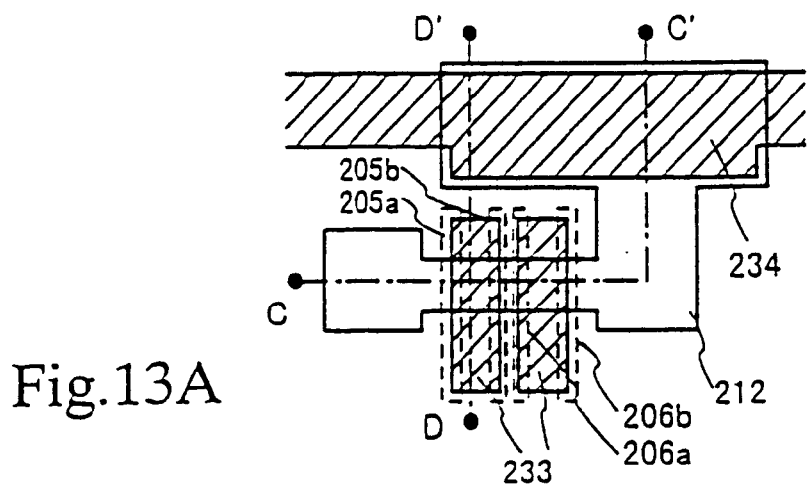
FIGS. 13A to 13C are top views showing the steps of manufacturing a pixel TFT.
Figure 14A:
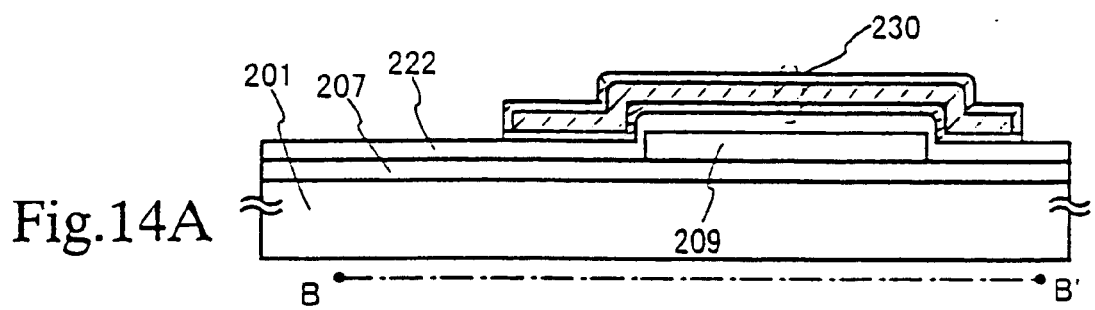
FIGS. 14A to 14C are cross-sectional views showing the steps of manufacturing a TFT for a driver circuit.
Figure 15A:
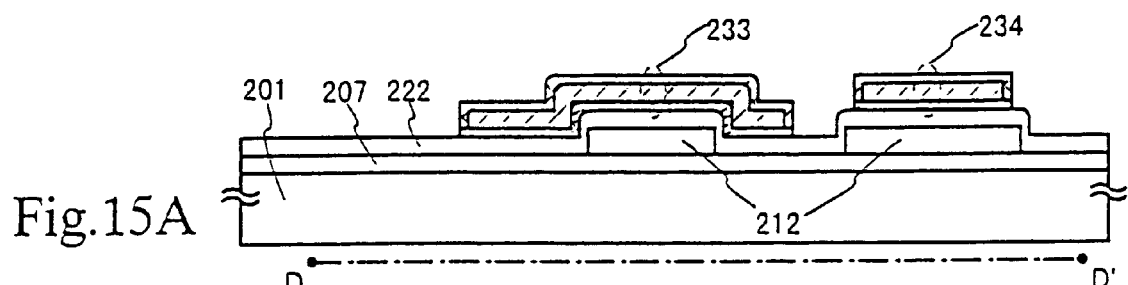
FIGS. 15A to 15C are cross-sectional views showing the steps of manufacturing a pixel TFT.

FIGS. 12A and 13A are top views of TFTs in FIG. 9D. Lines A-A' and C-C' in FIGS. 12A and 13A correspond to lines A-A' and C-C' in FIG. 9D. Furthermore, cross-sections taken along lines B-B' and D-D' correspond to cross-sections taken along lines B-B' and D-D' in FIGS. 14A and 15A. Although a gate insulating film is not shown in FIGS. 12A and 13A, the gate electrodes 230, 231, and 233 and the retention capacitor line 234 are formed over the island-like semiconductor layers 209, 210, and 212 formed on the first and second insulating layers as shown in FIGS. 12A and 13A.

Figure 10A:
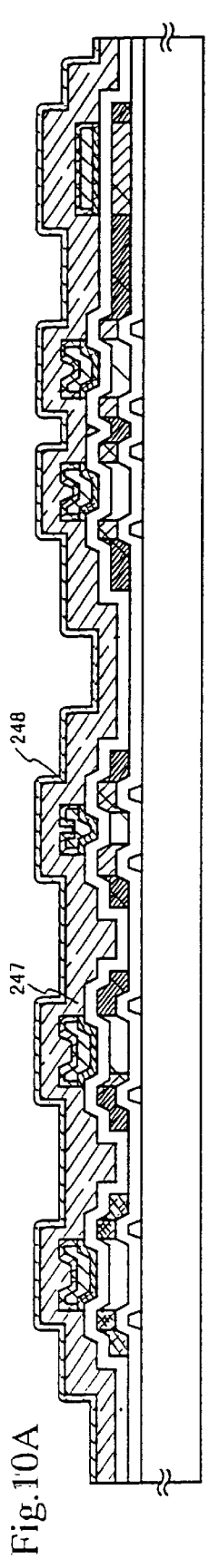
FIGS. 10A to 10C are cross-sectional views showing the steps of manufacturing a pixel TFT and a TFT for a driver circuit.

After activation and hydrogenation are finished, a second conductive layer for forming a gate line is formed. The second conductive layer is formed of a conductive layer (D) mainly containing aluminum (Al), copper (Cu), or the like that are low-resistant materials. In any case, the resistance of the second conductive layer is prescribed to be about 0.1 to about 10 μΩcm. Furthermore, a conductive layer (E) formed of titanium (Ti), tantalum (Ta), tungsten (W), molybdenum (Mo) or the like is preferably formed. In this embodiment, the conductive layer (D) 247 is formed of an aluminum (Al) film containing 0.1 to 2% by weight of titanium (Ti), and the conductive layer (E) 248 is formed of a titanium (Ti) film. The conductive layer (D) 247 is preferably formed to a thickness of 200 to 400 nm (preferably 250 to 350 nm), and the conductive layer (E) 248 is preferably formed to a thickness of 50 to 200 nm (preferably, 100 to 150 nm) (FIG. 10A).

Figure 10B:
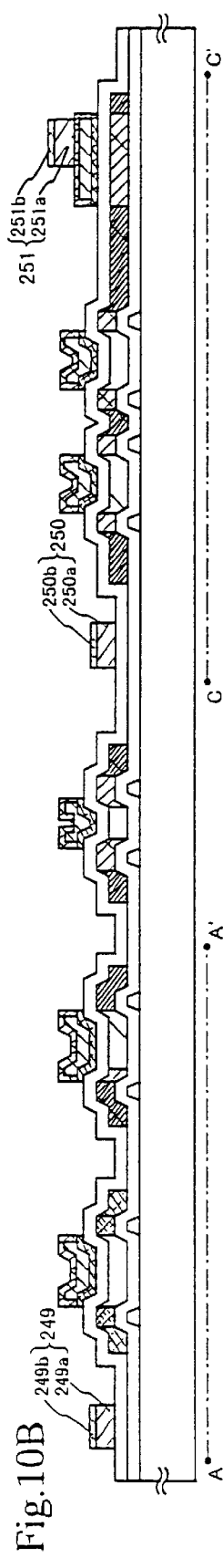

The conductive layer (E) 248 and the conductive layer (D) 247 are etched for forming gate lines connected to the gate electrodes to form gate lines 249 and 250 and a capacitor line 251. Etching is first conducted by dry etching using a mixed gas of SiCl$_4$, Cl$_2$, and BCl$_3$, in which the conductive layer (E) 248 is removed from its surface to the middle of the conductive layer (D) 247. Thereafter, the conductive layer (D) 247 is removed by wet etching using an etchant of phosphoric acid type, whereby gate lines can be formed, keeping selective processability with respect to the underlying layers (FIG. 10B).

Figure 12B:
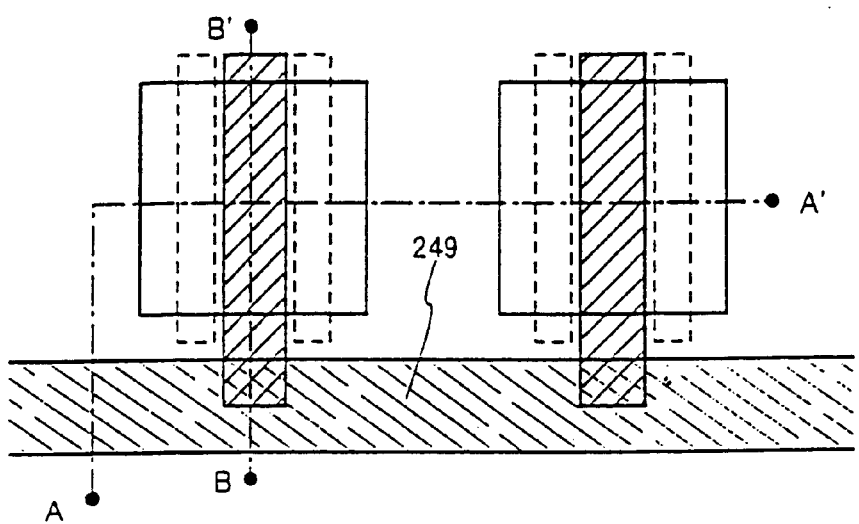
Figure 13B:
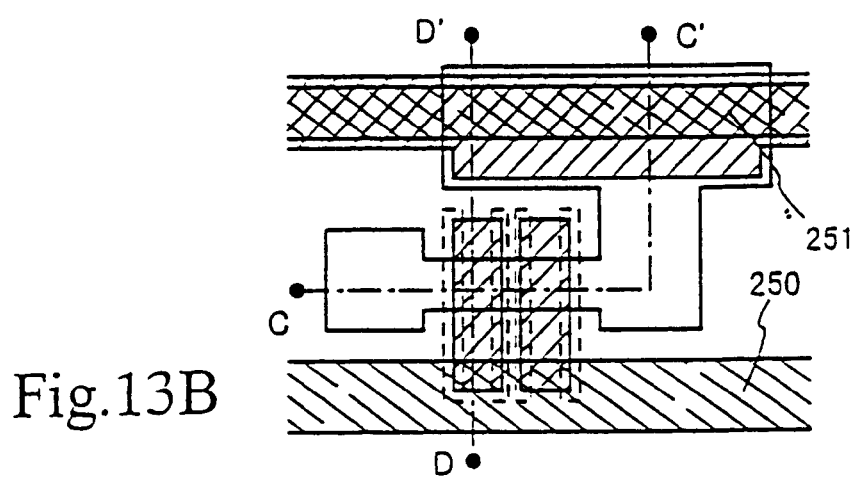
Figure 14B:
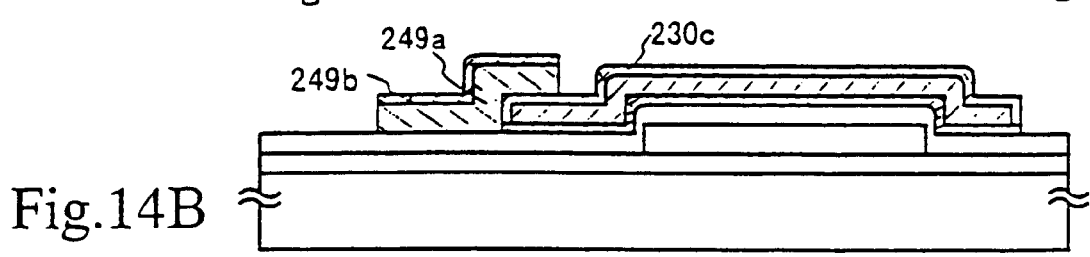
Figure 15B:
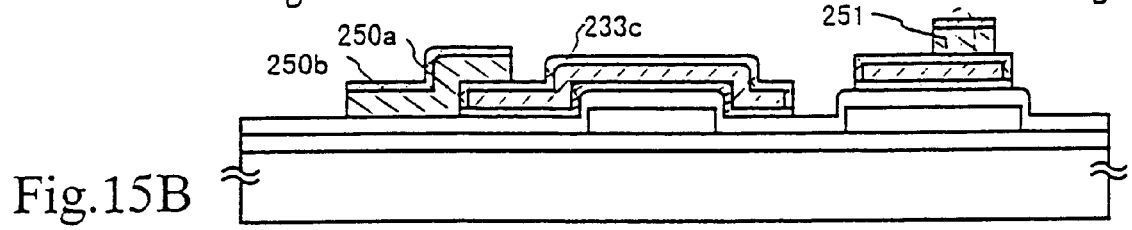

FIGS. 12B and 13B show top views in the above state. Lines A-A' and C-C' in FIGS. 12B and 13B correspond to lines A-A' and C-C' in FIG. 10B. Furthermore, the cross-sections taken along lines B-B' and D-D' correspond to those taken along lines B-B' and D-D' in FIGS. 14B and 15B. In FIGS. 12B and 13B, the gate lines 249 and 250 partially overlap the gate electrodes 230, 231, and 233 so as to be electrically connected thereto. This state is also apparent from the cross-sectional structure in FIGS. 14B and 15B corresponding the cross-sections taken along lines B-B' and D-D'. The conductive layer (C) forming the first conductive layer is electrically connected to the conductive layer (D) forming the second conductive layer.

A first interlevel insulator 252 is formed of a silicon oxide film or a silicon oxide nitride film with a thickness of 500 to 1500 nm. In this embodiment, the first interlevel insulator 252 is formed under the conditions of 27 SCCM of SiH$_4$, 900 SCCM of N$_2$O, a reactive pressure of 160 Pa, a substrate temperature of 325° C., and a discharge power density of 0.15 W/cm$^2$. Thereafter, contact holes are formed so as to reach the source regions or the drain regions formed on the respective island-like semiconductor layers, and source lines 253 to 256 and drain lines 257 to 260 are formed. Although not shown, in this embodiment, this electrode is formed as a three-layered structure in which a Ti film (100 nm), an aluminum film (300 nm) containing Ti, and a Ti film (150 nm) are continuously formed by sputtering.

Figure 10C:
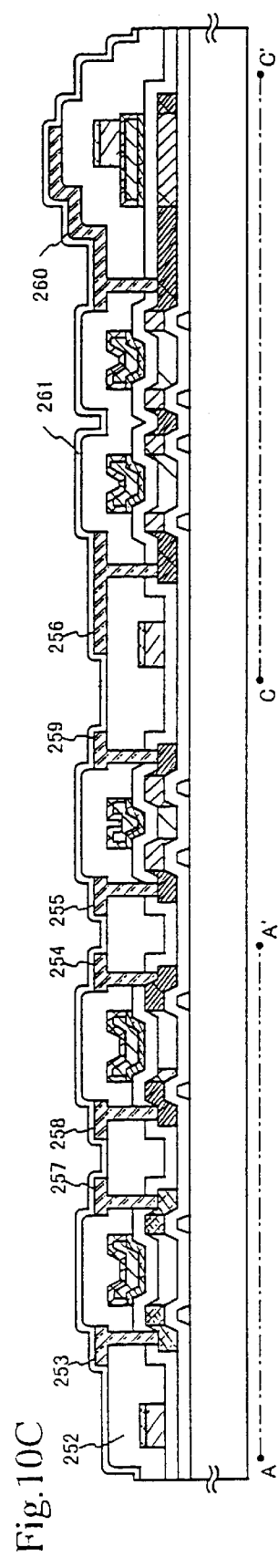

Next, a silicon nitride film, a silicon oxide film, or a silicon oxide nitride film is formed to a thickness of 50 to 500 nm (preferably 100 to 300 nm) as a passivation film 261. If hydrogenation is conducted in this state, preferable results for enhancement of TFT characteristics are obtained. For example, heat treatment may be conducted at 300° C. to 450° C. for 1 to 12 hours in an atmosphere containing 3 to 100% hydrogen. Alternatively, similar results can be obtained even by using plasma hydrogenation. Furthermore, hydrogen present in the first interlevel insulator 252 is diffused to the island-like semiconductor layers 209 to 212 by such heat treatment, whereby hydrogenation can be conducted. In any case, it is desirable to prescribe the defect density of the island-like semiconductor layers 209 to 212 to be 10$^{16}$/cm$^3$ or less. For this purpose, hydrogen should be added in an amount of 0.01 to 0.1 atom % (FIG. 10C). Herein, an opening may be formed in the passivation film 261 at a position where a contact hole is formed for connecting a pixel electrode to a drain line later.

Figure 12C:
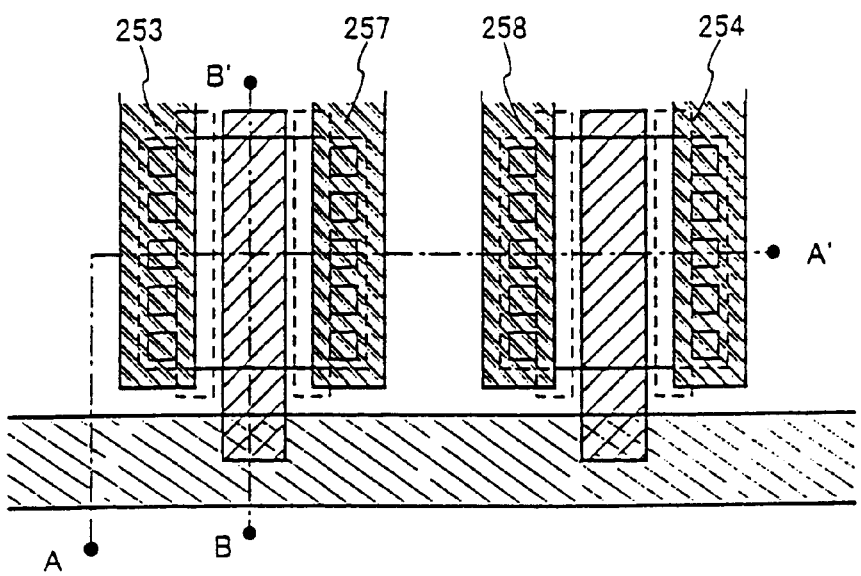
Figure 13C:
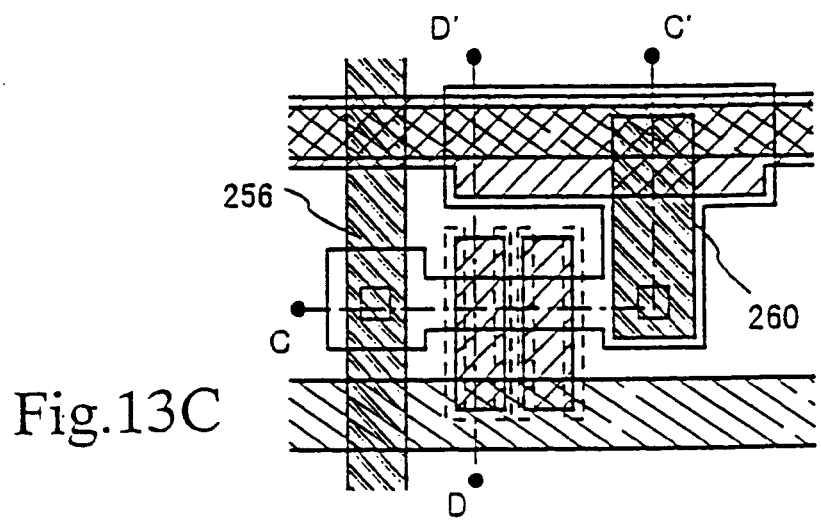
Figure 14C:
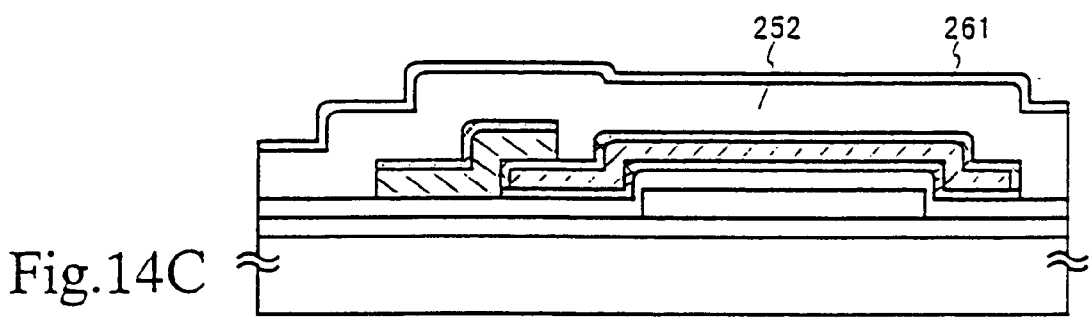
Figure 15C:
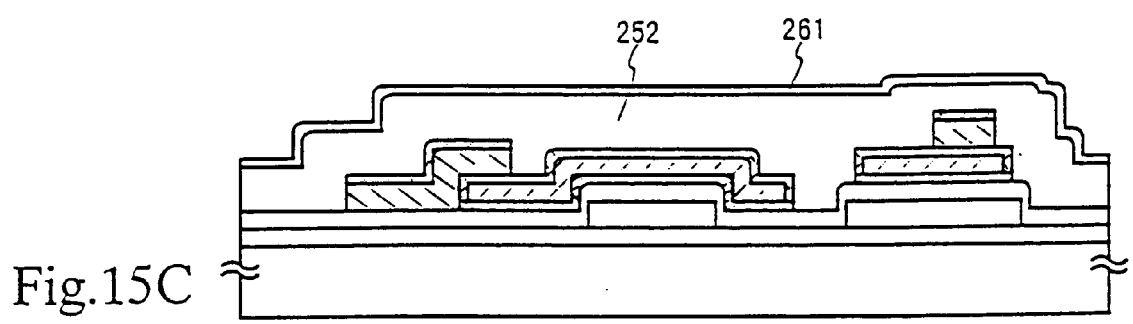

FIGS. 12C and 13C show top views in the above state. Lines A-A' and C-C' correspond to lines A-A' and C-C' in FIG. 10C. Furthermore, cross-sections taken along lines B-B' and D-D' correspond to those taken along lines B-B' and D-D' in FIGS. 14C and 15C. In FIGS. 12C and 13C, the first interlevel insulator 252 is not shown; however, in the source and drain regions (not shown) of the island-like semiconductor layers 209, 210, and 212, source lines 253, 254, and 256 are connected to drain lines 257, 258, and 260 through contact holes in the first interlevel insulator 252.

Figure 11:
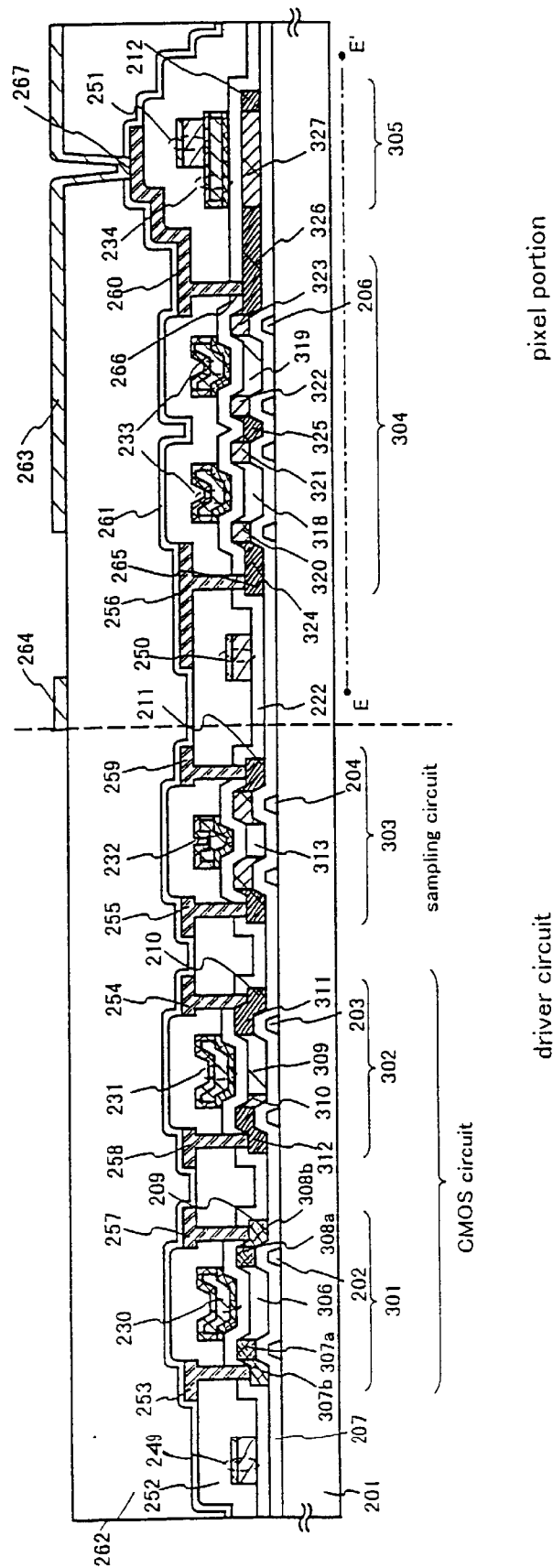
FIG. 11 is a cross-sectional view showing the steps of manufacturing a pixel TFT and a TFT for a driver circuit.

Thereafter, as shown in FIG. 11, a second interlevel insulator 262 made of organic resin is formed to a thickness of 1.0 to 1.5 μm. Examples of the organic resin include polyimide, acrylic resin, polyamide, polyimideamide, and BCB (benzocyclobutene). Herein, polyimide that is thermally polymerized after being applied to a substrate is used. The polyimide is baked to 300° C. to form the second interlevel insulator 262. Then, a contact hole is formed in the second interlevel insulator 262 so as to reach the drain line 260, and pixel electrodes 263 and 264 are formed. As the pixel electrodes 263 and 264, a transparent conductive film may be used in the case of manufacturing a transmission type liquid crystal display device. In the case of manufacturing a reflection type liquid crystal display device, a metal film may be used. In this embodiment, in order to produce a transmission type liquid crystal display device, a transparent conductive film selected from the group consisting of an indium tin oxide (ITO) film, a zinc oxide (ZnO) film, and an indium oxide/tin/zinc oxide film is formed to a thickness of 100 nm by sputtering.

Thus, TFTs for a driver circuit and a pixel TFT for a pixel portion can be formed on the same substrate. In the driver circuit, a p-channel TFT 301, a first n-channel TFT 302, and a second n-channel TFT 303 are formed, and in the pixel portion, a pixel TFT 304 and a retention capacitor 305 are formed. In this specification, such a substrate will be referred to as an active matrix substrate for convenience.

The p-channel TFT 301 in the driver circuit includes a channel formation region 306, source regions 307a and 307b, and drain regions 308a and 308b in the island-like semiconductor layer 209. The first n-channel TFT 302 includes a channel formation region 309, an LDD region (L$_{ov}$)310 overlapping the gate electrode 231, a source region 311, and a drain region 312 in the island-like semiconductor layer 210. The length of the LDD region(L$_{ov}$) 310 in the channel length direction is 0.5 to 3.0 μm, preferably 1.0 to 1.5 μm. The second n-channel TFT 303 includes a channel formation region 313, L$_{ov}$ region and L$_{off}$ region (LDD region that does not overlap the gate electrode; hereinafter, referred to as an "L$_{off}$" region) in the island-like semiconductor layer 211. The length of the L$_{off}$ region in the channel length direction is 0.3 to 2.0 μm, preferably 0.5 to 1.5 μm. The pixel TFT 304 includes channel formation regions 318 and 319, L$_{off}$ regions 320 to 323, and source or drain regions 324 to 326 in the island-like semiconductor layer 212. The length of the L$_{off}$ region in the channel length direction is 0.5 to 3.0 μm, preferably 1.5 to 2.5 μm. Furthermore, the retention capacitor 305 is composed of capacitor lines 234 and 251, an insulating film made of the same material as that of the gate insulating film, and a semiconductor layer 327 which is connected to the drain region 326 of the pixel TFT 304 and to which an n-type impurity element is added. In FIGS. 12A to 12C, the pixel TFT 304 has a double gate structure; however, it may have a single gate structure or a multi-gate structure in which a plurality of gate electrodes are provided.

Because of the above, it is possible that the structure of a TFT forming each circuit is optimized in accordance with the specification required by a pixel TFT or a driver circuit are optimized, and the operation performance and reliability of a semiconductor device can be enhanced. Furthermore, the gate electrodes are formed of a conductive material having heat resistance, whereby an LDD region, a source region, and a drain region can be easily activated. Furthermore, the gate lines are made of a low resistant material, whereby the resistance thereof can be sufficiently lowered. Thus, the present invention can be applied to a display device with a screen size of 4 inches or more. Furthermore, by using a crystalline silicon film having a single crystal structure selectively formed on the first insulating layers 203 to 206 (underlying layers), 0.10 V/dec to 0.30 V/dec of S-value, 0.5 volts to 2.5 volts of $V_{th}$, and 300 cm$^2$/V sec or more of field effect mobility can be realized in a completed n-channel TFT. Furthermore, in a p-channel TFT, 0.10 V/dec to 0.30 V/dec of S-value, −0.5 volts to −2.5 volts of $V_{th}$, and 200 cm$^2$/V sec or more of field effect mobility can also be realized.

[Embodiment 2]

Figure 16:
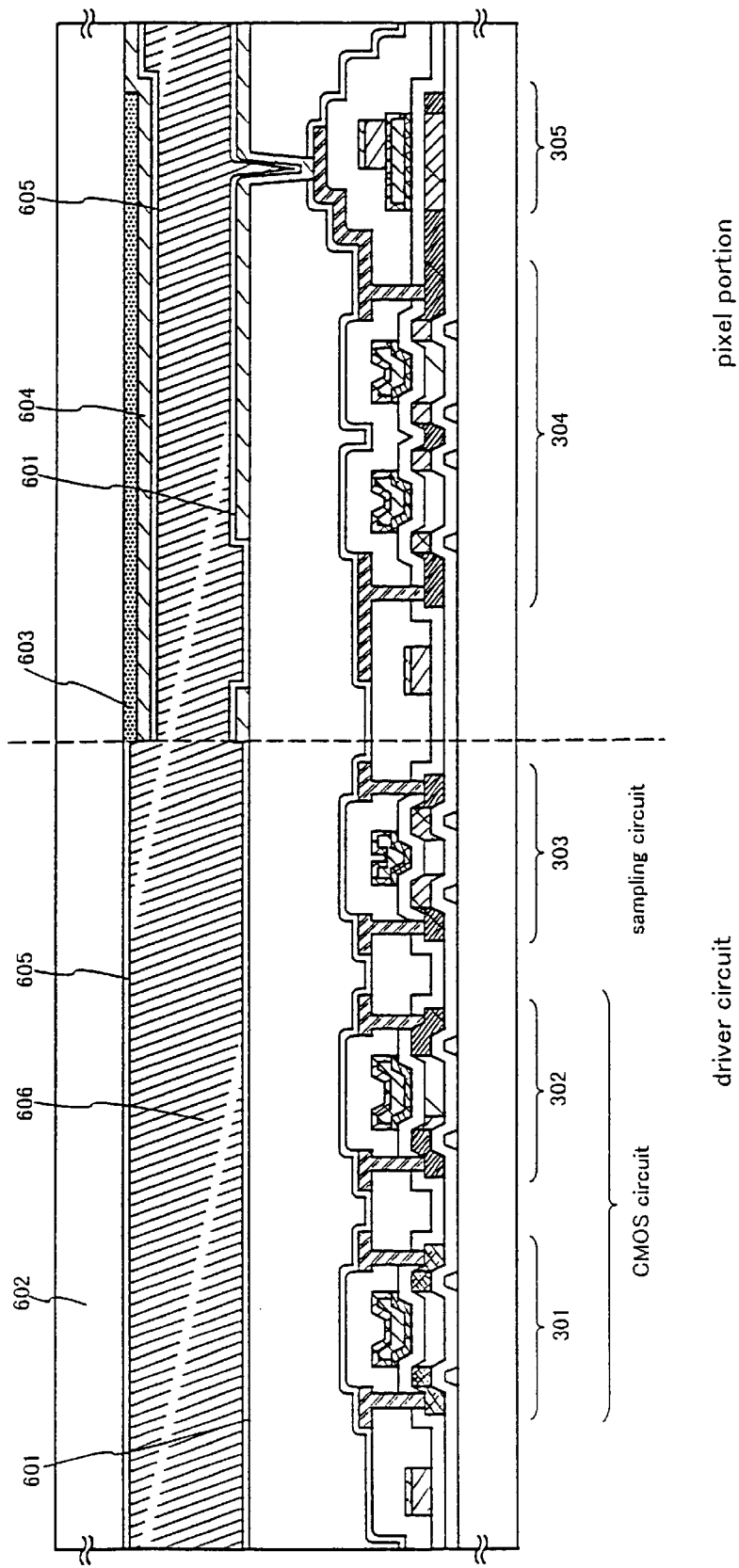
FIG. 16 is a cross-sectional view of an active matrix type liquid crystal display device.

In Embodiment 2, a process of manufacturing an active matrix liquid crystal display device from the active matrix substrate of Embodiment 1 is explained. As shown in FIG. 16, an alignment film 601 is formed for the active matrix substrate in the state of FIG. 11. A polyimide resin is often used for the alignment film of a liquid crystal display device. A light shielding film 603, a transparent conducting film 604, and an alignment film 605 are formed on an opposing substrate 602 of an opposing side. After forming the alignment films, a rubbing process is performed to give the liquid crystal molecules a certain fixed pre-tilt angle, bringing them into alignment. The active matrix substrate, on which the pixel matrix circuit and the CMOS circuit are formed, and the opposing substrate are then joined together by a sealing material or spacers (both not shown in the figures) in accordance with a known cell construction process. Next, a liquid crystal material 606 is injected between both substrates, and the cell is completely sealed by a sealant (not shown in the figures). A known liquid crystal material may be used as the liquid crystal material. Thus the active matrix liquid crystal display device shown in FIG. 16 is completed.

Figure 17:
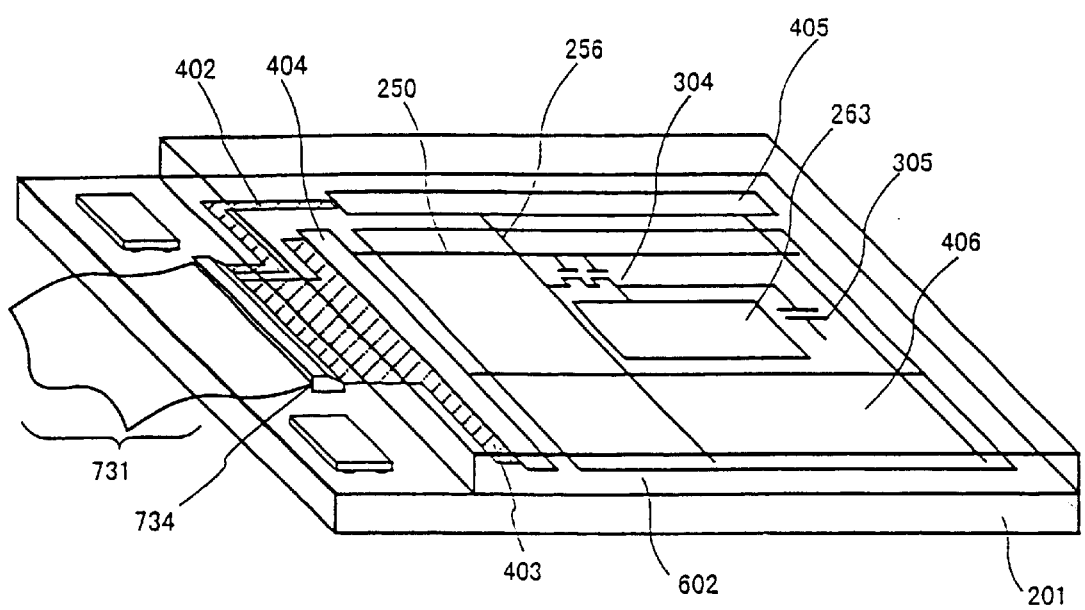
FIG. 17 is a perspective view showing the structure of a liquid crystal display device.
Figure 18:
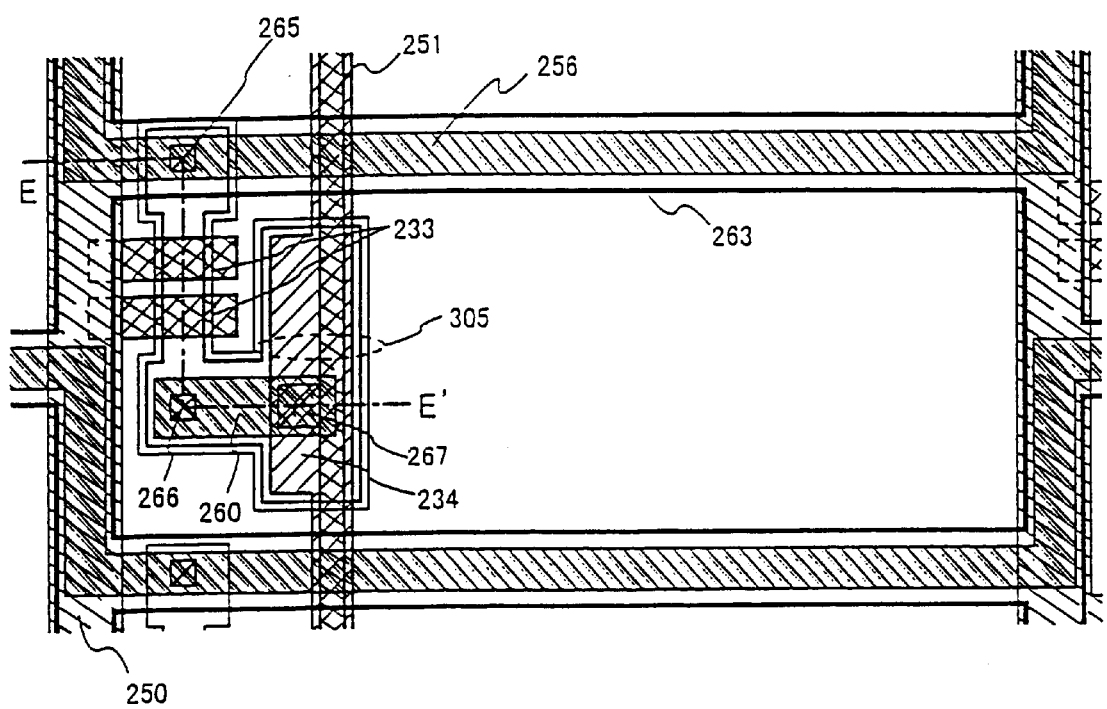
FIG. 18 is a top view showing a pixel structure of a pixel portion.

Next, the structure of the active matrix liquid crystal display device is explained using the perspective view of FIG. 17 and the top view of FIG. 18. Note that FIG. 17 and FIG. 18 correspond to the cross-sectional structure views of FIGS. 7 to 11 and FIG. 16, and therefore common symbols are used. Further, the cross-sectional structure taken along the line E-E' shown in FIG. 18 corresponds to the cross-sectional view of the pixel matrix circuit shown in FIG. 11.

In FIG. 17, the active matrix substrate is structured by a pixel portion 406, a scanning signal driver circuit 404, and an image signal driver circuit 405 formed on the glass substrate 201. The pixel TFT 304 is formed in the display region, and the driver circuit formed in the periphery is structured based on a CMOS circuit. The scanning signal driver circuit 404 and the image signal driver circuit 405 are connected to the pixel TFT 304 by the gate wiring 250 and the source wiring 256, respectively. Further, an FPC (flexible print circuit) 731 is connected to an external input terminal 734, and input wirings 402 and 403 are connected to the respective driver circuits.

FIG. 18 is an top view showing nearly one full pixel of the pixel portion 406. The gate wiring 250 intersects, through a gate insulating film not shown in the figure, with the semiconductor layer 212 underneath. A source region, a drain region, and an Loff region made from an n− region, are formed in the semiconductor layer, although not shown in the figure. Further, reference numeral 265 denotes a contact area of the source wiring 256 and the source region 324, reference numeral 266 denotes a contact area of the drain wiring 260 and the drain region 326, and reference numeral 267 denotes a contact area of the drain wiring 260 and the pixel electrode 263. The storage capacitor 305 is formed by the region in which the semiconductor layer 327 extending from the drain region 326 of the pixel TFT 304, and the region in which the capacitor wirings 234 and 251 overlap, through the gate insulating film.

Note that the active matrix liquid crystal display device of Embodiment 2 is explained in accordance with the structure explained in Embodiment 1, but it is not limited to the structure of Embodiment 1, and an active matrix substrate completed by applying the processes shown by Embodiment modes 1 to 3 and Embodiment 1 may also be used.

[Embodiment 3]

Figure 19:
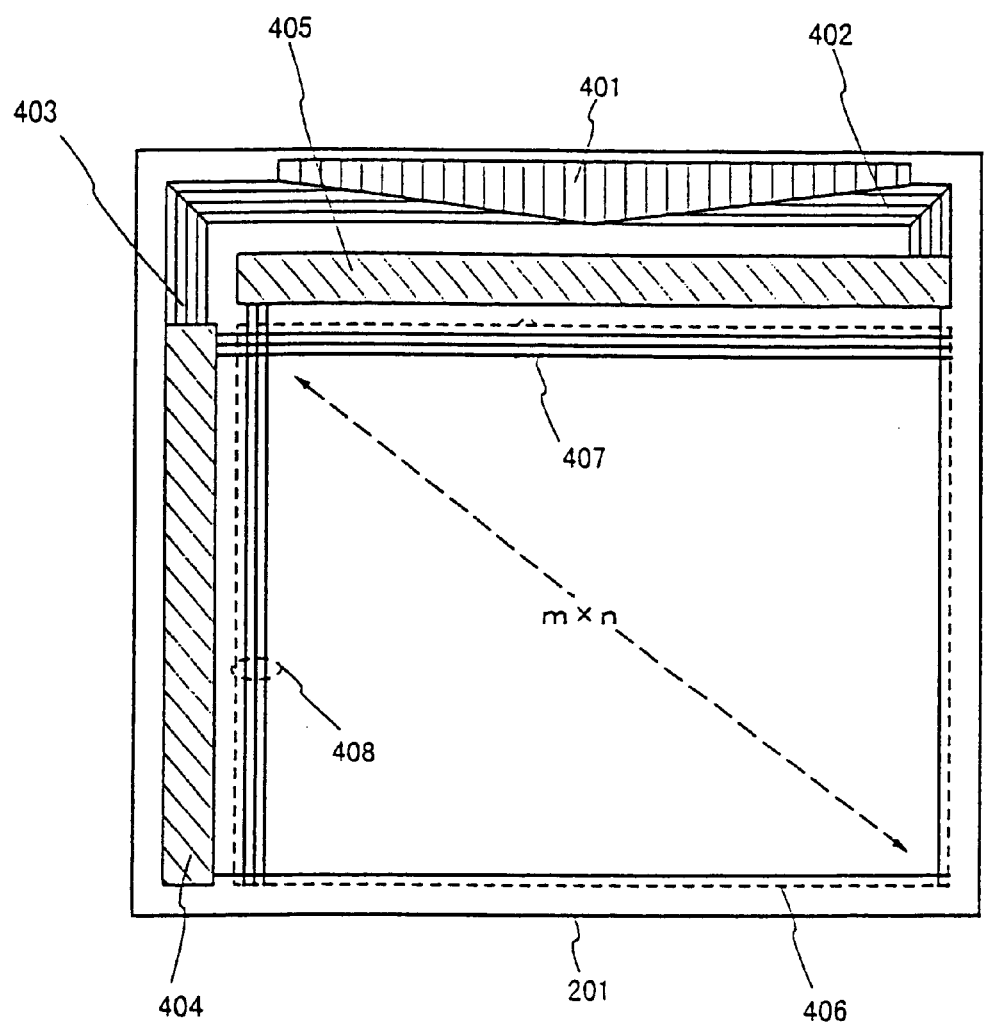
FIG. 19 is a top view illustrating the arrangement of an input/output terminal, lines, circuits, a spacer, and a sealant in the liquid crystal display device.

FIG. 19 is a schematic view showing an example of the arrangement of the input/output terminals, display region and driver circuits of a liquid crystal display device. In a pixel portion 406, m gate wiring lines 407, and n source wiring lines 408 are laid crosswise in a matrix shape. By way of example, in case of a pixel density of VGA, 480 gate wiring lines and 640 source wiring lines are laid, and in case of a pixel density of XGA, 768 gate wiring lines and 1024 source wiring lines are laid. Regarding the screen size of the display region, in case of the 13-inch class, the length of a diagonal line becomes 340 mm, and in case of the 18-inch class, the length becomes 460 mm. In incarnating such a liquid crystal display device, the gate wiring lines need to be formed of the low resistance material as explained in Embodiment 1. When the time constant (resistance× capacitance) of the gate wiring line enlarges, the response rate of a scanning signal lowers, and the liquid crystal cannot be driven at high speed. Byway of example, in a case where the specific resistance of a material forming the gate wiring line is 100 μWcm, a screen size of 6-inch class is substantially an upper limit, but in a case where the specific resistance is 3 μWcm, a screen size up to the 27-inch class can be coped with.

The scanning-signal driver circuit 404 and the image-signal driver circuit 405 are disposed peripherally of the display region 406. Since the lengths of the gate wiring lines of these driver circuits inevitably increase with the enlargement of the screen size of the display region, the gate wiring lines should preferably be formed of the low resistance material, such as aluminum (Al) or copper (Cu), mentioned in Embodiment 1, in order to realize a large screen. Moreover, according to the present invention, input wiring lines 402, 403 extending from the input terminal 401 to the respective driver circuits can be formed of the same material as that of the gate wiring lines, and this can contribute to lowering wiring resistances.

On the other hand, in a case where the screen size of the display region is of 0.9-inch class, the length of a diagonal line becomes about 24 mm. Herein, when the TFTs are fabricated in accordance with submicron rules, they can be confined within 30×30 mm$^2$ with the peripheral driver circuits included. In such a case, the gate wiring lines need not always be formed of the low resistance material as mentioned in Embodiment 1, but they can be formed of the same material as that of the gate electrodes, such as Ta or W.

The liquid crystal display device of such a construction can be finished up using the active matrix substrate which has been completed by applying any of the crystallizing methods explained in Embodiments 1 to 3, and Embodiment 1. Anyway, the active matrix substrates completed by the crystallizing techniques explained in Embodiments modes 1 to 3 can be freely combined to fabricate the active matrix type liquid crystal display device.

[Embodiment 4]

Figure 20A:
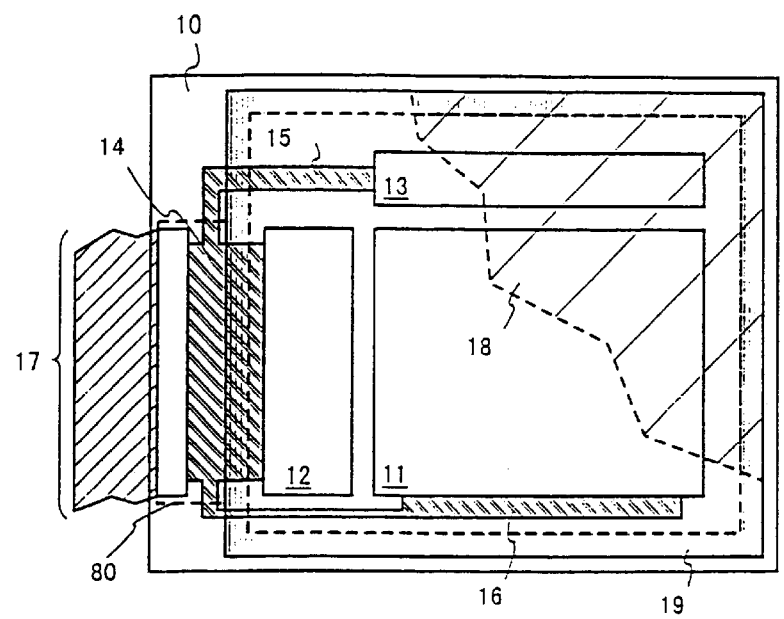
FIG. 20A is a top view showing the structure of an EL display device.

In this embodiment, the case will be described where an EL (electroluminescence) display panel (EL display device) is formed using an active matrix substrate according to the present invention. FIG. 20A is a top view of an EL display panel using the present invention. In FIG. 20A, reference numeral 10 denotes a substrate, 11 denotes a pixel portion, 12 denotes a source-side driver circuit, and 13 denotes a gate-side driver circuit. Each driver circuit is connected to an FPC 17 through lines 14 to 16 so as to be connected to external equipment.

A counter substrate 18 is provided so as to cover at least the pixel portion 11, preferably the driver circuits 12 and 13 and the pixel portion 11. The counter substrate 18 is attached to the active matrix substrate, on which TFTs and an EL layer are formed, with a sealant 81. A gap between the active matrix substrate and the counter substrate 18 is filled with a resin material 20 of a silicone type, a phenol type, an epoxy type, an acryl type, or the like. An EL element is weak to moisture such as water and is likely to be degraded, so that it is effective to mix a drying agent such as barium oxide in the resin material 20 so as to enhance resistance to moisture. As the counter substrate 18, a glass plate, a plastic plate, a metal plate, or the like can be used. In this manner, the EL element is completely sealed in the gap, and is not exposed to the outside air.

Figure 20B:
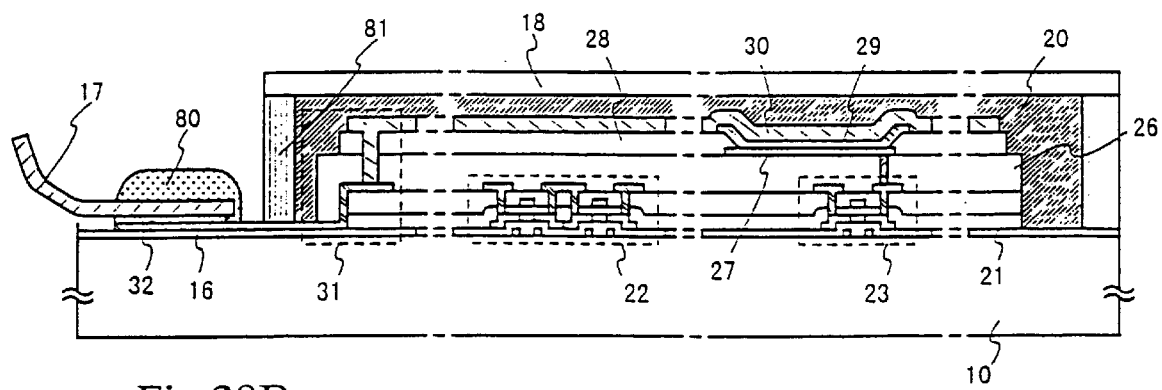
FIG. 20B is a cross-sectional view thereof.

Furthermore, FIG. 20B is a cross-sectional view of the EL display panel in this embodiment. On the substrate 10 and an underlying film 21, a TFT 22 for a driver circuit (herein, a CMOS circuit is shown, which is a combination of an n-channel TFT and a p-channel TFT) and a TFT 23 for a pixel portion (herein, only a TFT for controlling a current to the EL element is shown) are formed. As the TFT 22 for a driver circuit, the n-channel TFT 302 or the p-channel TFT 301 shown in FIG. 11 can be used. Furthermore, as the TFT 23 for a pixel portion, the n-channel TFT 304 shown in FIG. 11 or a p-channel TFT having a similar structure can be used.

After completing the TFT 22 for a driver circuit and the TFT 23 for a pixel portion by using the present invention, a pixel electrode 27 made of a transparent conductive film electrically connected to a drain of the TFT 23 for a pixel portion is formed on an interlevel insulator (flattening film) 26 made of resin material. As the transparent conductive film, a compound (ITO) of indium oxide and tin oxide or a compound of indium oxide and zinc oxide can be used. When the pixel electrode 27 is formed, an insulating film 28 is formed, and an opening is formed in the pixel electrode 27.

Next, an EL layer 29 is formed. The EL layer 29 can have a layered structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, or an ink jet method can be used.

In this embodiment, the EL layer 29 is formed by vapor deposition using a shadow mask. By forming light-emitting layers (red light-emitting layer, green-light emitting layer, and blue light-emitting layer) capable of emitting light with different wavelengths on the pixel basis, using a shadow mask, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a negative electrode 30 is formed thereon. It is desirable to remove moisture and oxygen present at an interface between the negative electrode 30 and the EL layer 29 as much as possible. Thus, it is required to continuously form the EL layer 29 and the negative electrode 30 in a vacuum, or to form the EL layer 29 in an inactive atmosphere, and form the negative electrode 30 without exposing the EL layer 29 to the outside air. In this embodiment, for this purpose, a film formation device of a multi-chamber system (cluster tool system) is used.

In this embodiment, as the negative electrode 30, a layered structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known negative electrode material may be used. The negative electrode 30 is connected to the line 16 in a region denoted by reference numeral 31. The line 16 is a power supply line for supplying a predetermined voltage to the negative electrode 30, and is connected to the FPC 17 via a conductive paste material 32. A resin layer 80 is further formed on the FPC 17 so as to enhance adhesiveness in this portion.

In order to electrically connect the negative electrode 30 to the line 16 in the region 31, it is required to form contact holes in the interlevel insulator 26 and the insulating film 28. The contact holes may be formed during etching of the interlevel insulator 26 (during formation of a contact hole for a pixel electrode) or during etching of the insulating film 28 (during formation of an opening before forming the EL layer). Furthermore, when the insulating film 28 is etched, the interlevel insulator 26 may also be etched together. In this case, if the interlevel insular 26 and the insulating film 28 are made of the same resin material, the shape of the contact holes can be made satisfactory.

Furthermore, the line 16 is electrically connected to the FPC 17 through a gap between the sealant 81 and the substrate 10 (the gap is filled with an adhesive 19). Herein, although description is made with respect to the line 16, the other lines 14 and 15 are also electrically connected to the FPC 17 through a gap between the sealant 81 and the substrate 10.

Figure 21:
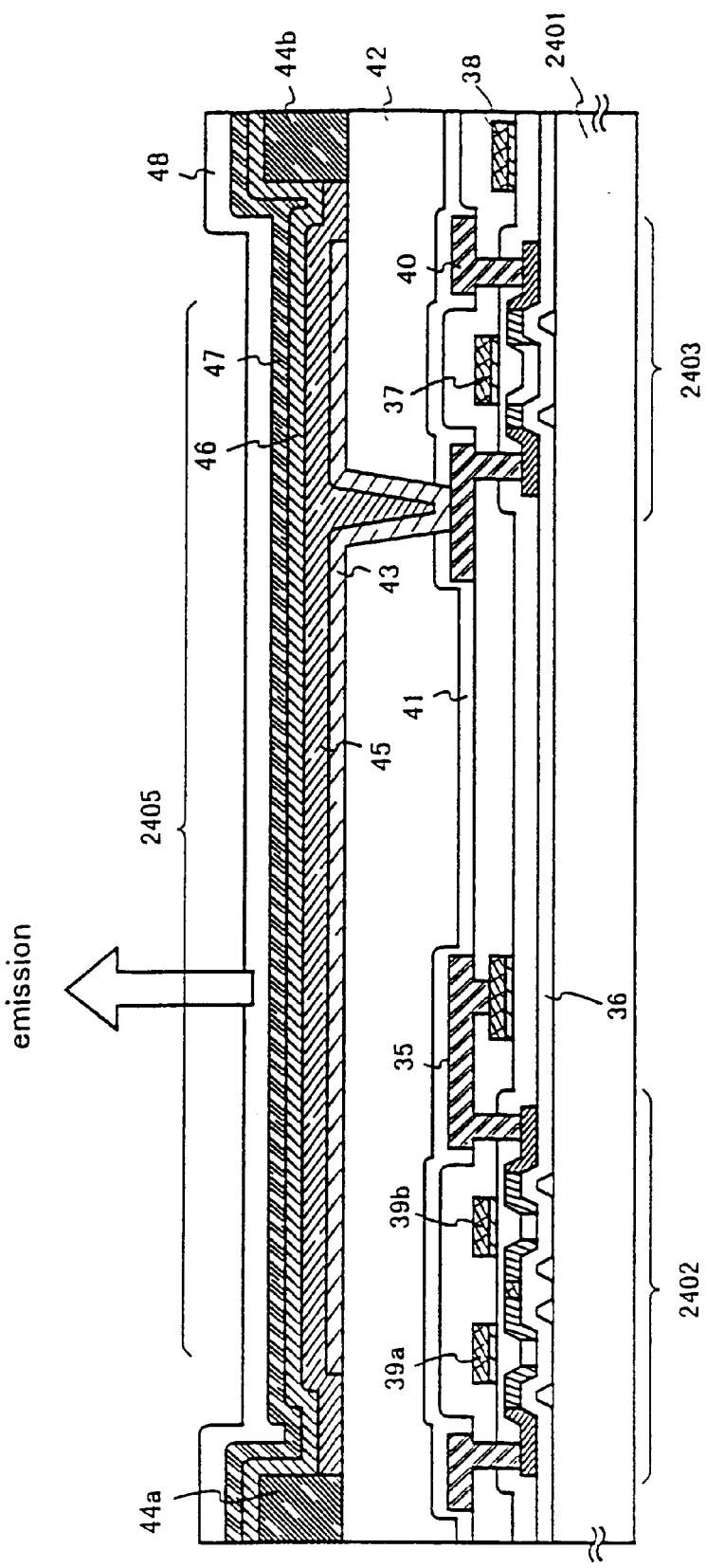
FIG. 21 is a cross-sectional view of a pixel portion of the EL display device.
Figure 22A:
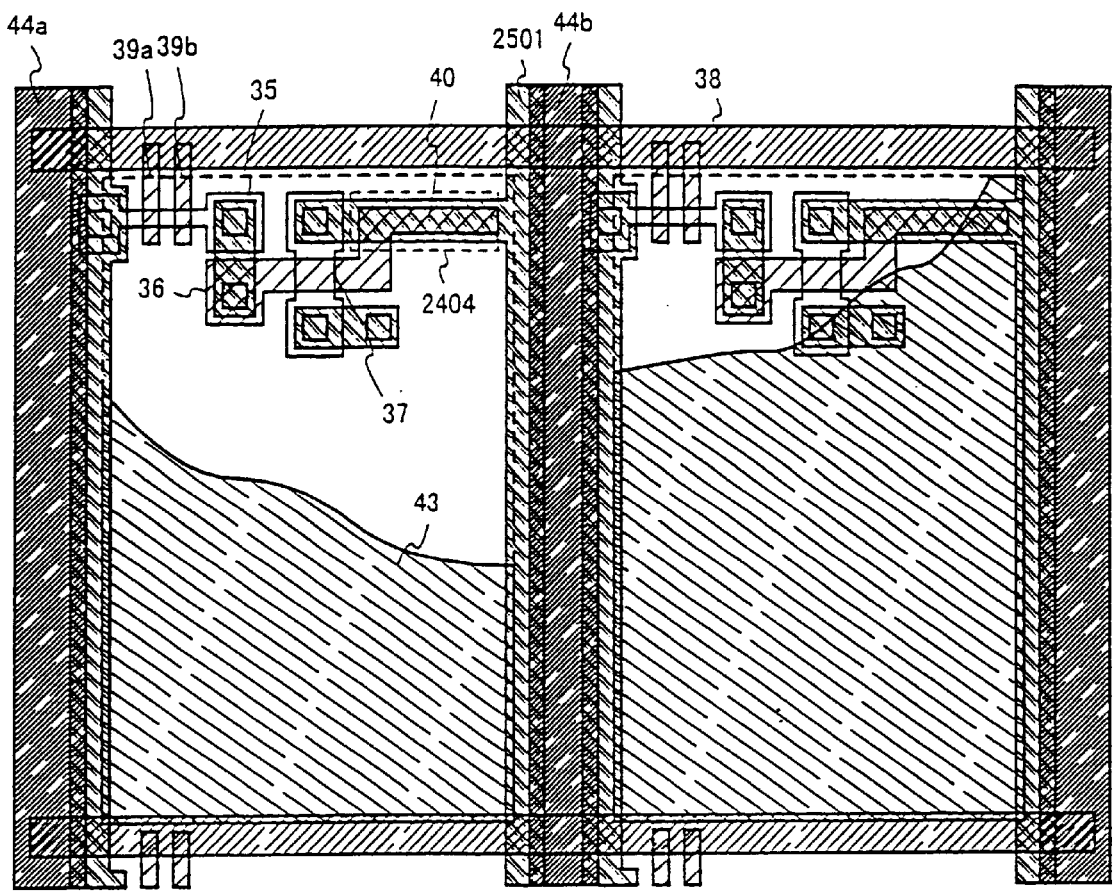
FIG. 22A is a top view of the pixel portion of the EL display device.
Figure 22B:
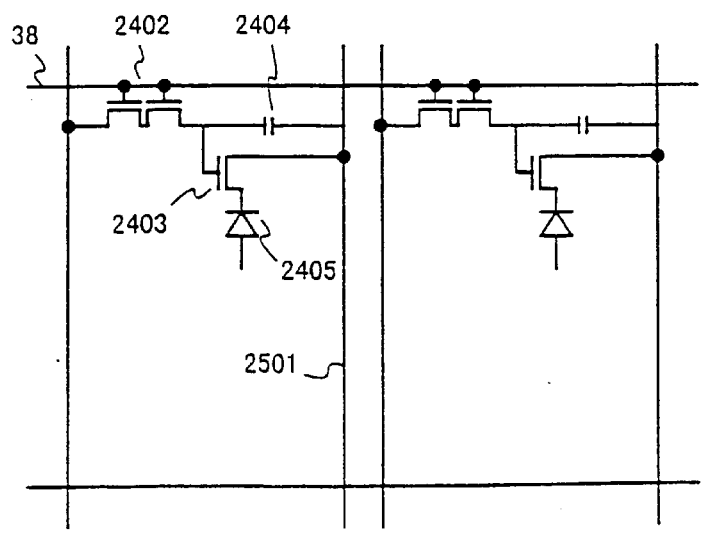
FIG. 22B is a circuit diagram thereof.

The present invention can be applied to the EL display panel with the above-mentioned structure. FIG. 21 shows a more detailed cross-sectional structure of the pixel portion. FIG. 22A shows a top view thereof, and FIG. 22B shows a circuit diagram thereof. In FIGS. 21, 22A, and 22B, the same components are denoted with the same reference numerals.

In FIG. 21, a TFT 2402 for switching provided on a substrate 2401 is formed by using the n-channel TFT 303 shown in FIG. 11 according to the present invention. In this embodiment, the TFT 2402 has a double-gate structure. Since there is no substantial difference in its structure and production process, its description will be omitted. Due to the double-gate structure, there is an advantage in that substantially two TFTs are connected in series to reduce an OFF current value. In this embodiment, the TFT 2402 has a double-gate structure; however, it may have a single gate structure, a triple gate structure, or a multi-gate structure having 4 or more gates. Alternatively, a p-channel TFT according to the present invention may be used.

A TFT 2403 for controlling a current is formed by using the n-channel TFT 302 shown in FIG. 11. A drain line 35 of the TFT 2402 is electrically connected to a gate electrode 37 of the TFT 2403. Furthermore, a line 38 is a gate line electrically connected to gate electrodes 39a and 39b of the TFT 2402.

At this time, it is very important that the TFT 2403 has a structure according to the present invention. The TFT 2403 functions for controlling the amount of a current flowing through an EL element, so that the TFT 2403 is likely to be degraded by heat and hot carriers due to a large amount of current flown therethrough. Therefore, the structure of the present invention is very effective, in which an LDD region is provided in the drain side of the TFT 2403 so as to overlap the gate electrode (strictly speaking, a side wall functioning as a gate electrode) via the gate insulating film.

Furthermore, in this embodiment, the TFT 2403 has a single gate structure. However, it may have a multi-gate structure in which a plurality of TFTs are connected in series. Furthermore, it may also be possible that a plurality of TFT are connected in parallel to substantially divide a channel formation region into a plurality of parts, so as to conduct highly efficient heat release. Such a structure is effective for preventing degradation due to heat.

As shown in FIG. 22A, a line to be the gate electrode 37 of the TFT 2403 overlaps a drain line 40 of the TFT 2403 via an insulating film in a region 2404. In the region 2404, a capacitor is formed. The capacitor 2404 functions for holding a voltage applied to a gate of the TFT 2403. The drain line 40 is connected to a current supply line (power source line) 2501 so as to be always supplied with a constant voltage.

A first passivation film 41 is provided on the TFT 2402 and the TFT 403, and a flattening film 42 that is made of a resin insulating film is formed thereon. It is very important to flatten the step difference due to TFTs by using the flattening film 42. The step difference may cause a light-emitting defect because the EL layer to be formed later is very thin. Thus, it is desirable to flatten the step difference before forming a pixel electrode, so that the EL layer is formed on a flat surface.

Reference numeral 43 denotes a pixel electrode (negative electrode of an EL element) that is made of a conductive film with high reflectivity and is electrically connected to the drain of the TFT 2403. As the pixel electrode 43, a low resistant conductive film such as an aluminum alloy film, a copper alloy film, and a silver alloy film, or a layered structure thereof can be preferably used. Needless to say, a layered structure with other conductive films may also be used.

A light-emitting layer 45 is formed in a groove (corresponding to a pixel) formed by banks 44a and 44b made of an insulating film (preferably resin). Herein, only one pixel is shown; however, light-emitting layers corresponding to each color R (red), G (green), and B (blue)) may be formed. As an organic EL material for the light-emitting layer, a π-conjugate polymer material is used. Examples of the polymer material include polyparaphenylene vinylene (PPV), polyvinyl carbazole (PVK), and polyfluorene.

There are various types of PPV organic EL materials. For example, materials as described in "H. Shenk, Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 $\mu$m).

The above-mentioned organic EL materials are merely examples for use as a light-emitting layer. The present invention is not limited thereto. A light-emitting layer, a charge-transporting layer, or a charge injection layer may be appropriately combined to form an EL layer (for light emitting and moving carriers therefor).

For example, in this embodiment, the case where a polymer material is used for the light-emitting layer has been described. However, a low molecular-weight organic EL material may be used. Furthermore, an inorganic material such as silicon carbide can also be used for a charge-transporting layer and a charge injection layer. As these organic EL materials and inorganic materials, known materials can be used.

In this embodiment, an EL layer with a layered structure is used, in which a hole injection layer 46 made of DEPOT (polythiophene) or PAni (polyaniline) is provided on the light-emitting layer 45, and a positive electrode 47 made of a transparent conductive film is provided on the hole injection layer 46. In this embodiment, light generated by the light-emitting layer 45 is irradiated toward the upper surface, so that the positive electrode 47 must be transparent to light. As a transparent conductive film, a compound of indium oxide and tin oxide, or a compound of indium oxide and zinc oxide can be used. The transparent conductive film is formed after forming the light-emitting layer 45 and the hole injection layer 46 with low heat resistance, so that the transparent conductive film that can be formed at a possibly low temperature is preferably used.

When the positive electrode 47 is formed, the EL element 2405 is completed. The EL element 2405 refers to a capacitor composed of the pixel electrode (negative electrode) 43, the light-emitting layer 45, the hole injection layer 46, and the positive electrode 47. As show in FIG. 22A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the positive electrode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 21, and includes a TFT for switching having a sufficiently low OFF current value and a TFT for controlling a current that is strong to the injection of hot carriers. Thus, an EL display panel is obtained, which has high reliability and is capable of displaying a satisfactory image.

This embodiment can be realized by being appropriately combined with Embodiments 1 to 3 and Embodiment 1. Furthermore, it is effective to use the EL display panel of this embodiment as a display portion of electronic equipment of Embodiment 8.

[Embodiment 5]

In this embodiment, referring to FIG. 23, the case will be described where the structure of the EL element 2405 is reversed in the pixel portion described in Embodiment 4. The difference from the structure shown in FIG. 22A lies only in the EL element and the TFT for controlling a current, so that the description of the other parts will be omitted.

Figure 23:
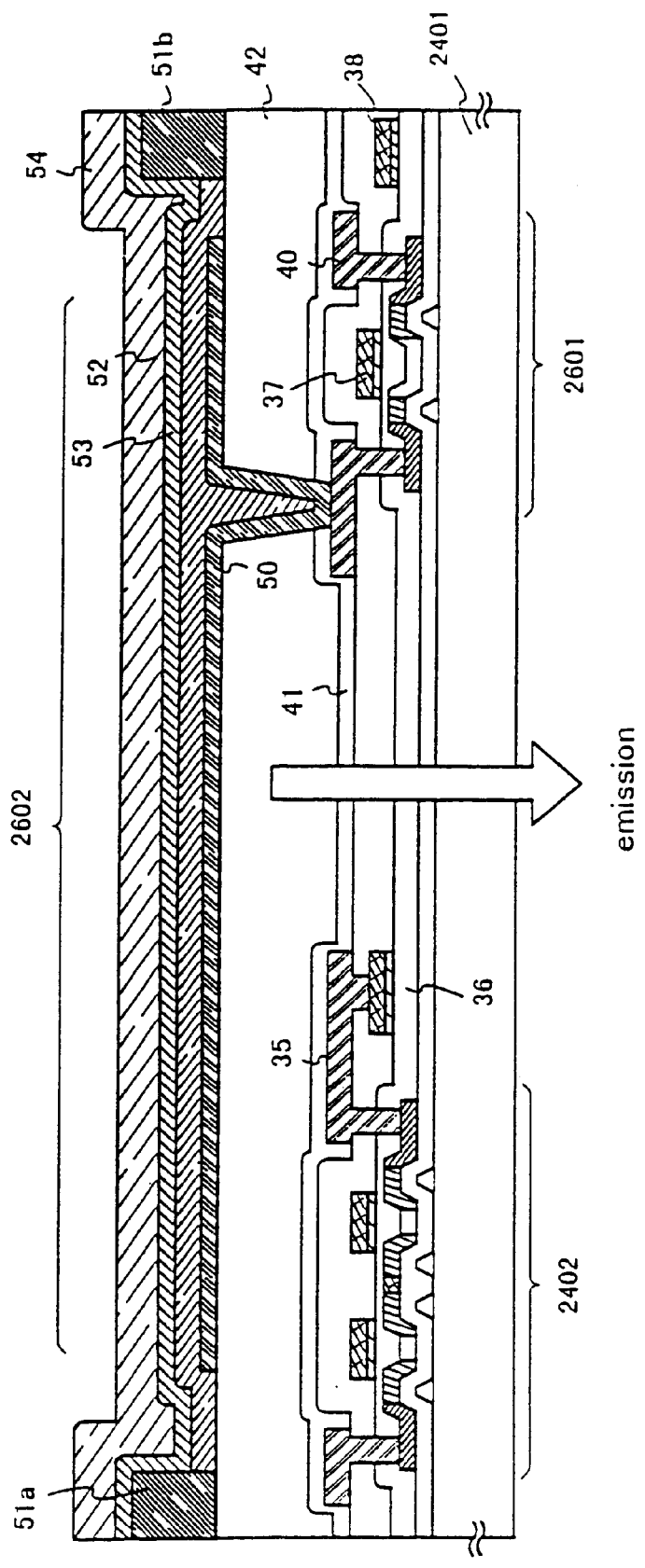
FIG. 23 is a cross-sectional view of the pixel portion of the EL display device.

In FIG. 23, a TFT 2601 for controlling a current is formed of a p-channel TFT according to the present invention. Regarding the production process, Embodiment 1 should be referred to. In this embodiment, a transparent conductive film is used as a pixel electrode (positive electrode) 50. More specifically, a conductive film made of a compound of indium oxide and zinc oxide is used. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a negative electrode 54 made of an aluminum alloy are formed. In this case, the negative electrode 54 functions as a passivation film. Thus, an EL element 2602 is formed.

In this embodiment, light generated by the light-emitting layer 52 is irradiated toward the substrate on which a TFT is formed as represented by an arrow. In the case of the structure of this embodiment, it is preferable that the TFT 2601 for controlling a current is formed of a p-channel TFT.

This embodiment can be realized by being appropriately combined with Embodiment Modes 1 to 3 and Embodiment 1. Furthermore, it is effective to use the EL display panel of this embodiment as a display portion of electronic equipment of Embodiment 8.

[Embodiment 6]

In this embodiment, referring to FIGS. 24A to 24C, the case will be described where a pixel having a different structure from that of the circuit diagram shown in FIG. 22B is used. Reference numeral 2701 denotes a source line of a TFT 2702 for switching, 2703 denotes a gate line of the TFT 2702 for switching, 2704 denotes a TFT for controlling a current, 2705 denotes a capacitor, 2706 and 2708 denote current supply lines, and 2707 denotes an EL element.

Figure 24A:
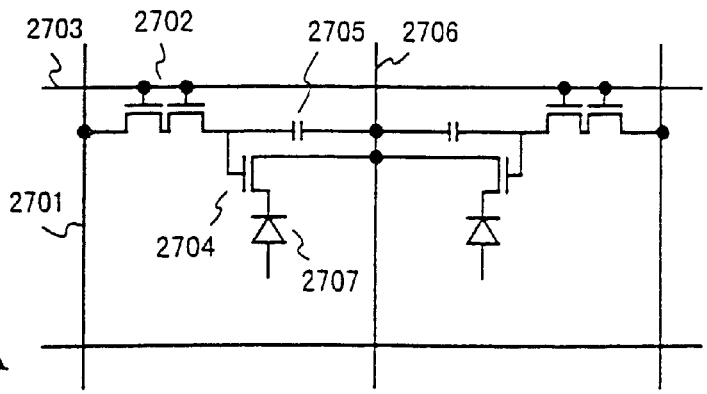
FIGS. 24A to 24C show examples of circuit diagrams of the pixel portion of the EL display device.

FIG. 24A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 24B:
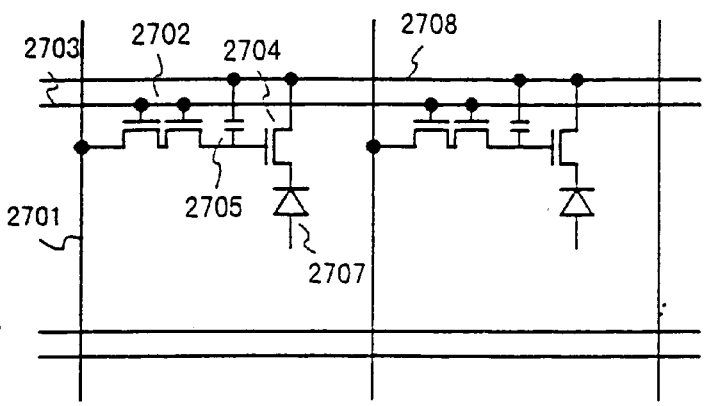

Furthermore, FIG. 24B shows the case where the current supply line 2708 and the gate line 2703 are provided in parallel. In FIG. 24B, although the current supply line 2708 does not overlap the gate line 2703, if both lines are formed on different layers, they can be provided so as to overlap each other via an insulating film. In this case, the current supply line 2708 and the gate line 2703 can share an occupied area, so that a pixel portion is allowed to have higher definition.

Figure 24C:
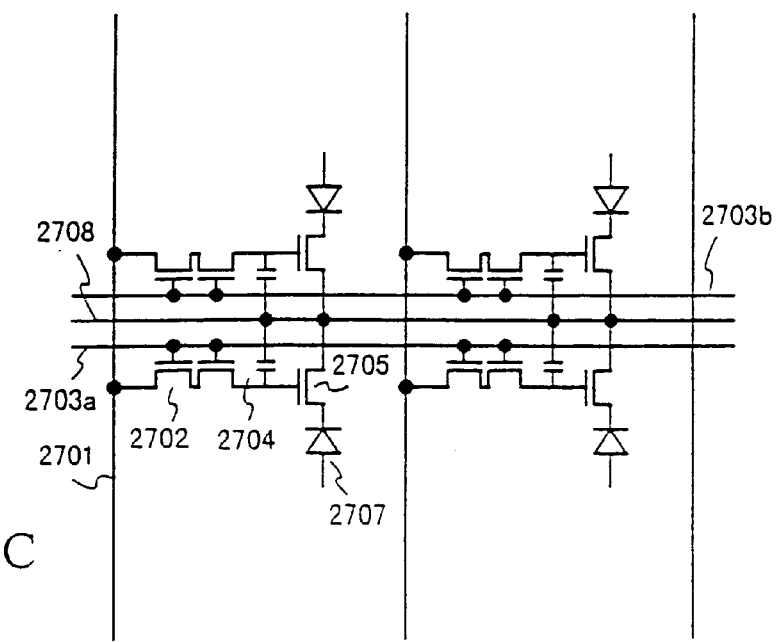

Furthermore, FIG. 24C shows the case where the current supply line 2708 and gate lines 2703a and 2703b are provided in parallel in the same way as in FIG. 24B, and two pixels are formed so as to be axisymmetric with respect to the current supply line 2708. It is also effective to provide the current supply line 2708 so as to overlap one of the gate lines 2703a and 2703b. In this case, the number of the power supply lines can be reduced, so that a pixel portion is allowed to have higher definition.

In FIGS. 24A and 24B, the capacitor 2705 is provided so as to hold a voltage applied to a gate of the TFT 2704 for controlling a current. However, the capacitor 2705 can be omitted.

Since the n-channel TFT according to the present invention as shown in FIG. 21 is used as the TFT 2704 for controlling a current, the TFT 2704 has an LDD region provided so as to overlap a gate electrode via a gate insulating film. In this region, a parasitic capacitor called a gate capacitor is generally formed. This embodiment is characterized in that the parasitic capacitor is used in place of the capacitor 2705.

The capacitance of the parasitic capacitor is varied depending upon the above-mentioned area in which the gate electrode overlaps the LDD region. Therefore, the capacitance is determined by the length of the LDD region included in the region.

Similarly, in FIGS. 24A, 24B, and 24C, the capacitor 2705 can also be omitted.

This embodiment can be realized by being appropriately combined with the structures of Embodiment Modes 1 to 3 and Embodiment 1. Furthermore, it is effective to use an EL display panel having a pixel structure of this embodiment as a display portion of electronic equipment of Embodiment 8.

[Embodiment 7]

In addition to a nematic liquid crystal, it is also possible to use various other liquid crystals in a liquid crystal display device shown in Embodiment 2. For example, it is possible to use the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; Yoshida, T., et al., "A Full-color Thresholdless Antiferroelectric LCD Exhibiting Wide Viewing Angle with Fast Response Time," SID Digest, 841, 1997; J. Mater. Chem., 6(4), pp. 671–3, 1996; Inui, S., et al., "Thresholdless antiferroelectricity in liquid crystals and its application to displays," and U.S. Pat. No. 5,594,569.

Figure 25:
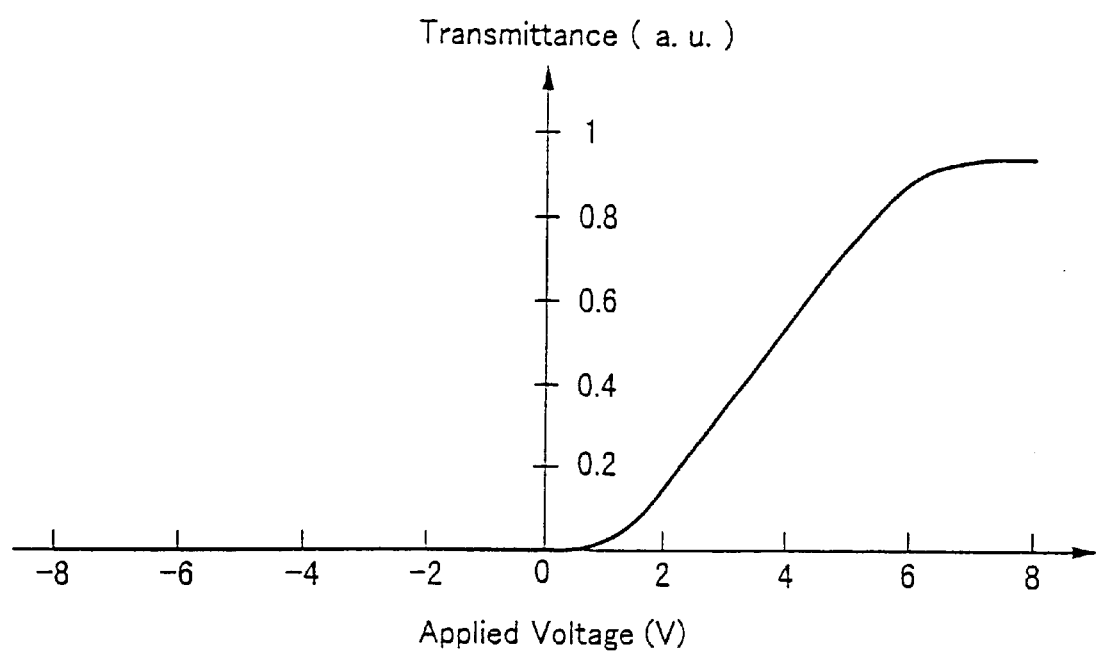
FIG. 25 shows an example of light transmittance characteristics of antiferroelectric mixed crystal.

The electro-optical characteristics of a monostable ferroelectric liquid crystal (FLC), in which an FLC showing a phase transition system of an isotropic phase—cholesteric phase—chiralsmectic phase is used, and in which a phase transition is caused from the cholesteric phase to the chiralsmectic phase, a cone edge being made to nearly conform with a rubbing direction while applying a DC voltage, are shown in FIG. 25. The display mode of a ferroelectric liquid crystal like that shown in FIG. 25 is referred to as a "half-V switching mode." The vertical axis of the graph shown in FIG. 25 is the transmittance (in arbitrary units), and the horizontal axis is the applied voltage. Details regarding the "half-V switching mode" may be found in: Terada, et al, "Half-V Switching Mode FLCD", Proceedings of the 46th Japan Society of Applied Physics Lectures, Mar. 1999, p. 1316; and in Yoshihara, et al, "Time-Division Full Color LCD by Ferroelectric Liquid Crystal", Liquid Crystals, vol. 3, no. 3, p. 190.

As shown in FIG. 25, it is apparent that if this type of ferroelectric mixed liquid crystal is used, it becomes possible to have a low voltage drive and a gray scale display. A ferroelectric liquid crystal that shows these electro-optical characteristics can be used in the display device of the present invention.

In addition, a liquid crystal that exhibits an anti-ferroelectric phase in a certain temperature range is referred to as an anti-ferroelectric liquid crystal (AFLC). There are mixed liquid crystals, which have an anti-ferroelectric liquid crystal, that show electro-optical response characteristics in which the transmittance continuously changes in response to the electric field, and are referred to as thresholdless anti-ferroelectric mixed liquid crystals. There are thresholdless antiferroelectric mixed liquid crystals that show so-called V-type electro-optical response characteristics, and some have been found to have a drive voltage of approximately 2.5 V (when the cell thickness is between 1 and 2 $\mu$m).

Further, in general the spontaneous polarization of a thresholdless antiferroelectric mixed liquid crystal is large, and the transmittance of the liquid crystal itself is high. It is thus necessary for a relatively large storage capacitor when a thresholdless antiferroelectric mixed liquid crystal is used for a liquid crystal display device. Therefore it is preferable to use a thresholdless antiferroelectric mixed liquid crystal that has a small spontaneous polarization.

Note that a low drive voltage can be realized by using this type of thresholdless antiferroelectric mixed liquid crystal in the liquid crystal display devices of the present invention, and therefore low power consumption can also be realized.

[Embodiment 8]

In this embodiment, an active matrix type crystal display device incorporated a semiconductor device by TFT circuits of this present invention is explained in FIG. 28, FIG. 29 and FIG. 30.

Mentioned as such semiconductor device, a portable information terminal (such as mobile computer, portable telephone set or electronic book), and so forth. Examples of the electronic equipment are illustrated in FIGS. 28 and 29.

Figure 28A:
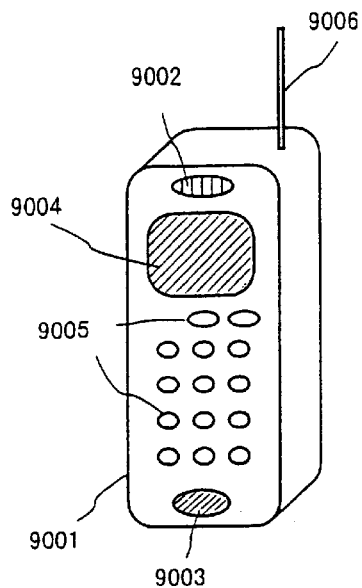
FIGS. 28A to 28F illustrate an example of a semiconductor device.

FIG. 28A shows a mobile phone, which includes the body 9001, a sound input unit 9003, display device 9004, an operating switch 9005, an antenna 9006. The present invention can be applied to the sound output unit 9002, a sound input unit 9003 and a display device 9004 equipped an active matrix substrate.

Figure 28B:
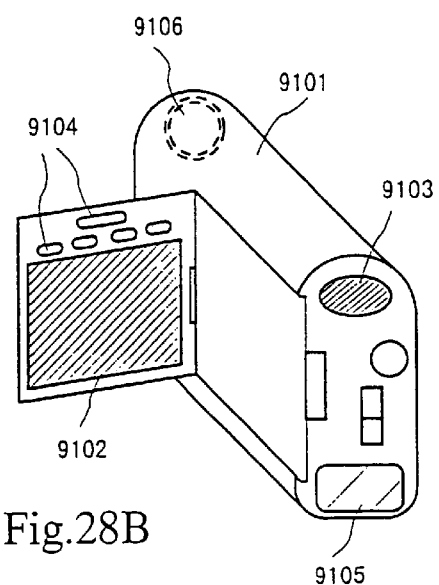

FIG. 28B shows a video camera, which includes the body 9101, a display unit 9102, a sound input unit 9103, operating switches 9104, a battery 9105, and an image receiving unit 9106. The present invention can be applied to the sound input unit 9103, a display device 9102 equipped an active matrix substrate and a an image receiving unit 9106.

Figure 28C:
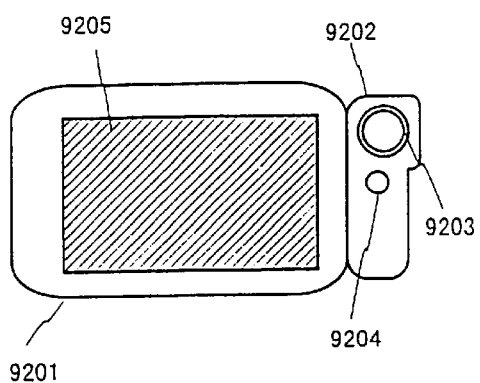

FIG. 28C shows a laptop computer, which includes the body 9201, camera unit 9202, an image receiving unit 9203, an operating switch 9204, a display unit 9205. The present invention can be applied to the display unit 9203, to the image receiving unit 9203 and a display device 9205 equipped an active matrix substrate.

Figure 28D:
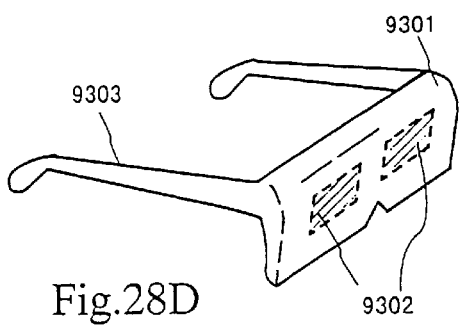

FIG. 28D shows a head mounted display, which includes the body 9301, a display device 9302, arm portion 9303. The present invention can be applied to the display device 9302, and used other signal control circuit although it is not shown in figures.

Figure 28E:
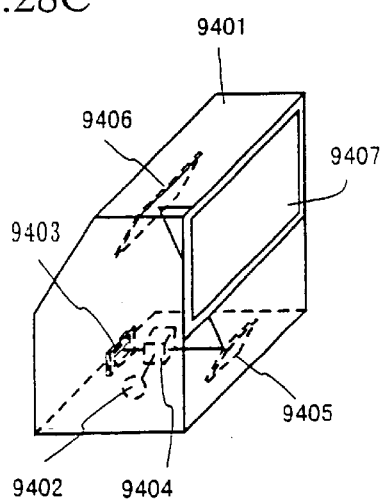

FIG. 28E shows a rear type projector, which includes the body 9401, an optical light source 9402, display unit 9403, a deflection beam splitter 9404, reflectors 9405, 9406, and a screen 9407. The present invention can be applied to the display unit 9403.

Figure 28F:
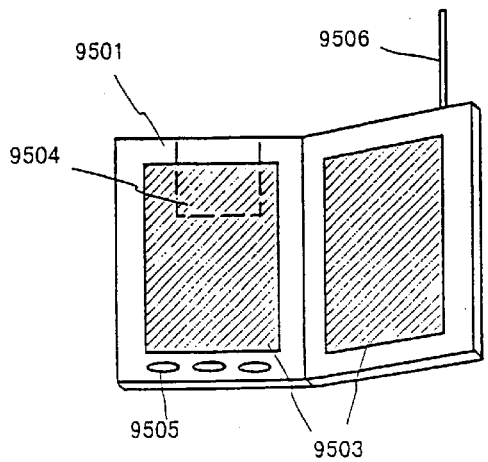

FIG. 28F shows a portable book, which includes the body 9501, display units 9502, 9503, the record medium 9504, an operating switch 9505 and an antenna 9506. This book displays a data recorded in mini disc (MD) and DVD, and a data received by an antenna. The display device 9502 and 9503 are direct view type, and the present invention can be applied these devices.

Figure 29A:
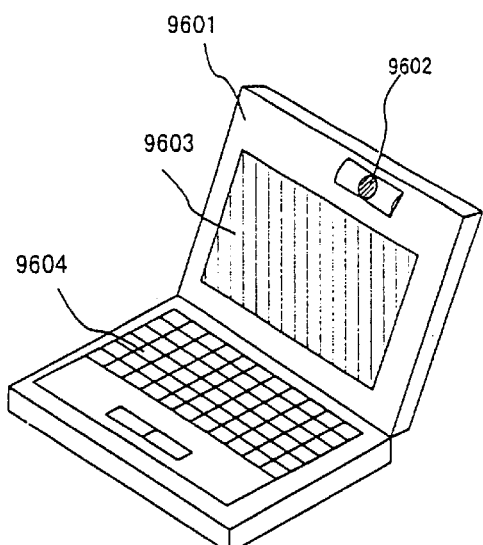
FIGS. 29A to 29C illustrate an example of the semiconductor device.

FIG. 29A shows a personal computer, which includes the body 9601, an image receiving unit 9602, a display device 9603 and a keyboard 9604.

Figure 29B:
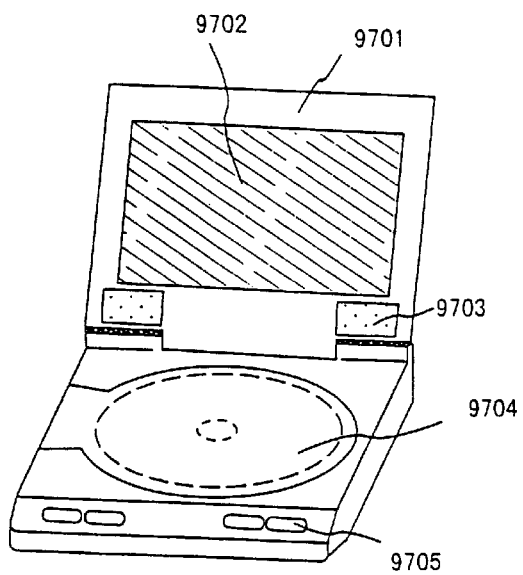

FIG. 29B shows a player using record medium (herein after recording medium) recorded a program, which includes the body 9701, the display unit 9702, the speaker unit 9703, the record medium 9704, the operating switches 9705. This equipment can be realized music appreciation, movie appreciation, playing game and Internet by using the DVD, CD etc. as a recording medium.

Figure 29C:
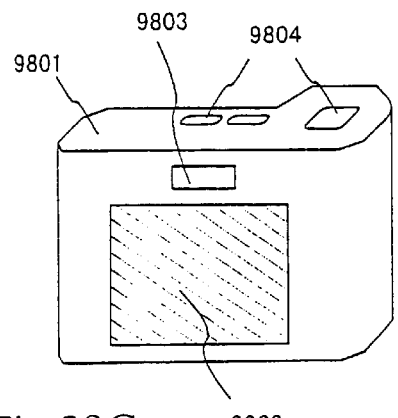

FIG. 29C shows a digital camera, which includes the body 9801, display unit 9802, a view finder 9803, the display device 9802, an operating switch 9804 and an image receiving unit (not shown).

Figure 30A:
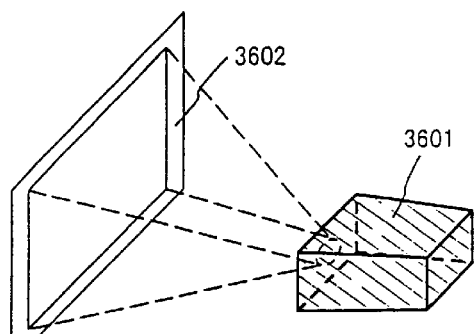
FIGS. 30A to 30D show the structure of a projection type liquid crystal display device.

FIG. 30A shows a front type projector, which includes the display unit 3601, and a screen 3602. The present invention can be applied to the display unit and other signal controlling circuit.

Figure 30B:
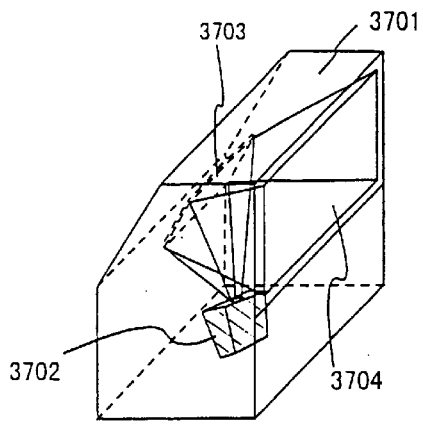

FIG. 30B shows a rear type projector, which includes the body 3701, the display unit 3702, a mirror 3703 and a screen 3704. The present invention can be applied to the display unit and other signal controlling circuit.

Figure 30C:
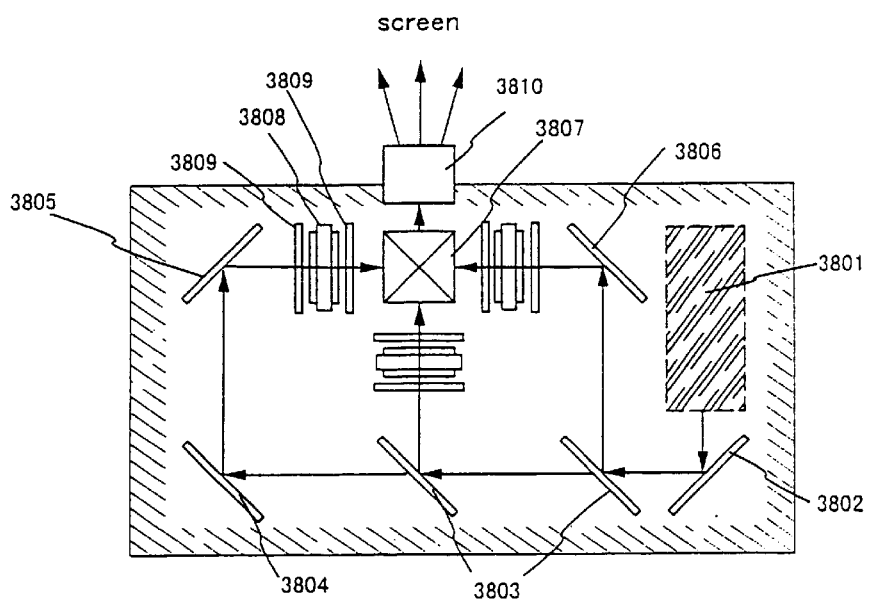

Illustrated in FIG. 30C is an example of the structure of the projection units 3601 and 3702 that are shown in FIGS. 30A and 30B, respectively. Each of the projection units 3601 and 3702 is comprised of a light source optical system 3801, mirrors 3802 and 3804 to 3806, dichroic mirrors 3803, a prism 3807, liquid crystal display devices 3808, phase difference plates 3809, and a projection optical system 3810. The projection optical system 3810 is constructed of an optical system including projection lenses. An example of a three plate system is shown in embodiment 8, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 30C.

Figure 30D:
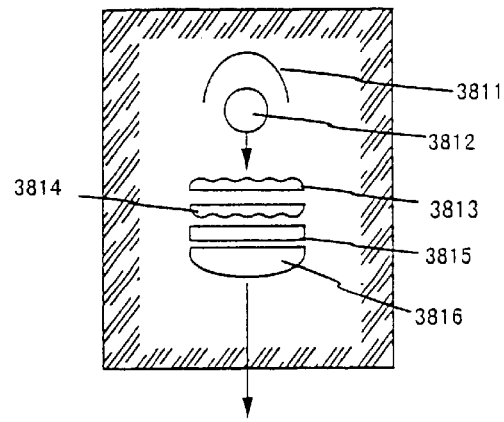

In addition. FIG. 30D shows an example of the structure of the light source optical system 3801 of FIG. 30C. In this embodiment, the light source optical system 3801 is composed of a reflector 3811, a light source 3812, lens arrays 3813 and 3814, a polarizing conversion element 3815, and a condenser lens 3816. Note that the light source optical system shown in FIG. 30D is an example, and it is not limited to the illustrated structure. For example, the operator may suitably set optical systems such as optical lenses, polarizing film, film to regulate the phase difference, and IR film.

Further the present invention is possible to apply to an image sensor and EL type display element. As described above, the present invention has very wide applications and is applicable to electronic equipment in all fields.

[Embodiment 9]

Figure 31:
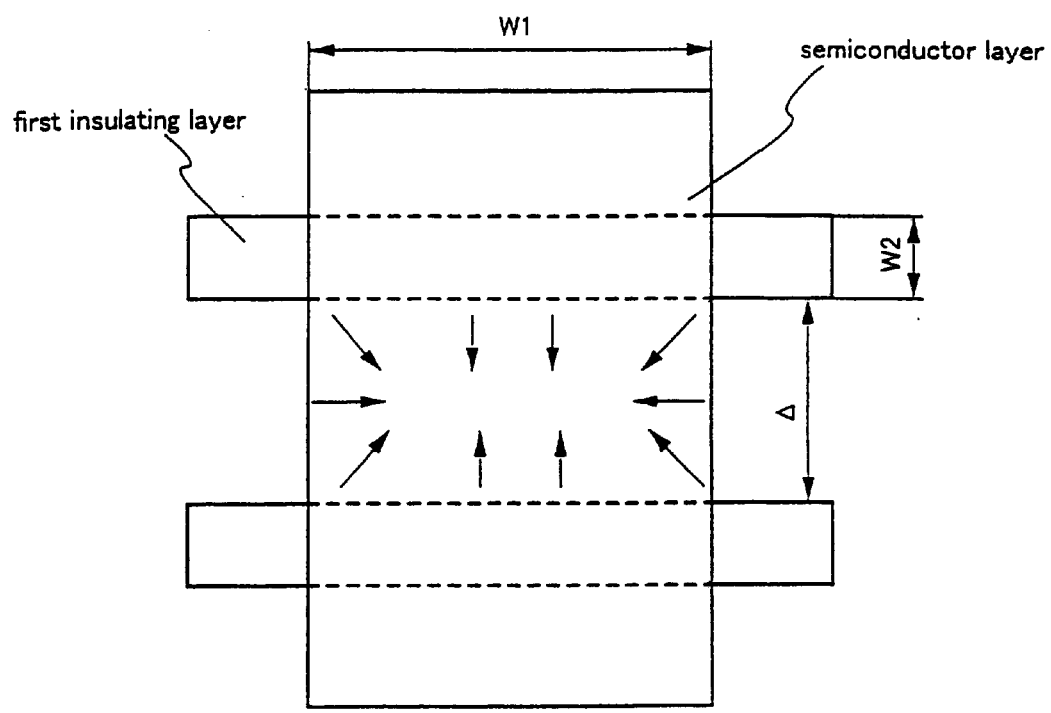
FIG. 31 illustrates a size relationship when a first insulating layer overlaps an island like semiconductor layer.

In this embodiment, by varying the width of each first insulating layer, the interval between the first insulating layers, and the width of an island-like semiconductor layer that crosses the first insulating layers in a width direction thereof, combinations that allow the size of crystal grains to increase were studied. As shown in FIG. 31, it is assumed that the width of strip-like first insulating layers is W2, the interval therebetween is Δ, and the width of an island-like semiconductor layer is W1: As shown in Table 1, W1 was varied in a range of 4 to 50 μm, W2 was varied in a range of 1 to 5 μm, and A was varied in a range of 2 to 10 μm. Furthermore, the first insulating layers, the second insulating layer, and the island-like semiconductor layer were formed to a thickness of 30 nm, 160 nm, and 55 nm, respectively. Crystallization was conducted by dual beam laser annealing at an energy of 460 mJ/cm$^2$.

Figure 32A:
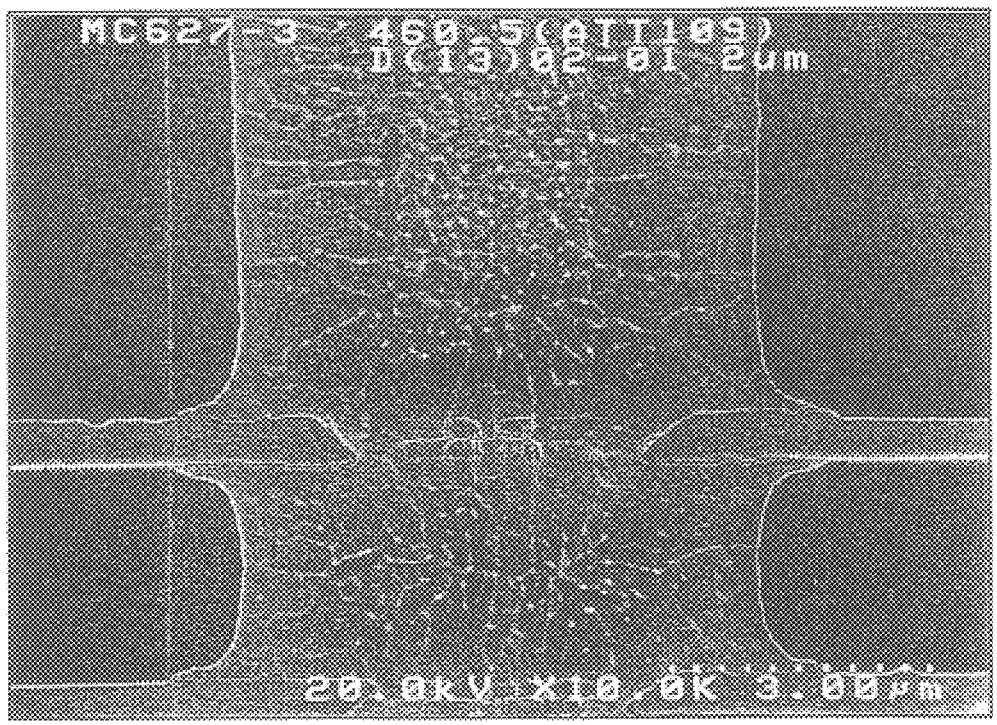
FIGS. 32A and 32B show SEM (scanning electron microscope) images of a crystalline semiconductor film manufactured according to the present invention.

The state of the crystallized semiconductor layer was observed with a scanning electron microscopy (SEM). FIG. 32A shows a SEM image of a sample (W1=8 μm, W2=1 μm, Δ=2 μm). The surface of the sample was etched with a SECO. solution (containing HF and H$_2$O as main components in a volume ratio of 67:33 and K$_2$Cr$_2$O$_7$ as an additive) so as to make crystal grains obvious. As represented by an arrow in FIG. 31, it is understood that crystal grew inward from step difference portions in which the first insulating layers were formed and the end portion of the island-like semiconductor layer.

Figure 32B:
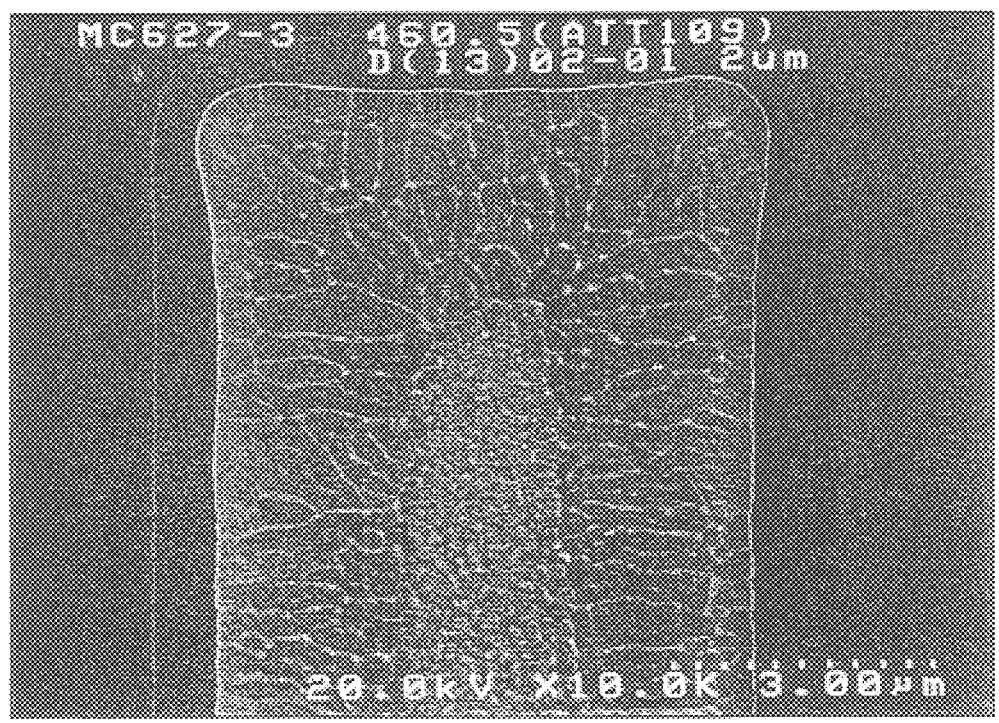

FIG. 32B shows the state of the end portions of the island-like semiconductor layer in the same sample in which the first insulating layers are not periodically formed. In this case, a region was observed in an inside portion of the island-like semiconductor layer, where small crystal grains were aggregated. Such a phenomenon supports the mechanism of crystallization described in this specification, which shows that crystal grains grow from a region where the island-like semiconductor layer overlaps the first insulating layers. Thus, there is an optimum range for W1 and Δ. As a result of evaluation of samples with various shapes, large crystal grains were generated in a region surrounded by a thick line in Table 1 (W1: about 4 to about 10 μm; Δ: about 2 to about 5 μm). On the other hand, W2 is preferably about 1 μm. If W2 is increased more, crystal growth in another mode was observed on the first insulating layers.

As a result of the above-mentioned experiment, it was found that a crystalline semiconductor layer containing large grains can be formed in accordance with a channel formation region of a TFT by appropriately combining the interval of the strip-like first insulating layers and the width of the island-like semiconductor layer.

What is claimed is:

1. A semiconductor device comprising:
a thin film transistor, the thin film transistor comprising:
an island-like semiconductor layer; and
a stripe-like first insulating layer provided below the island-like semiconductor layer over one surface of a substrate,
wherein the stripe-like first insulating layer crosses the island-like semiconductor layer.

2. A semiconductor device according to claim 1, wherein a second insulating layer is formed between the island-like semiconductor layer and the stripe-like first insulating layer.

3. A semiconductor device according to claim 1, wherein the stripe-like first insulating layer is formed of silicon oxide, silicon nitride, or silicon oxide nitride.

4. A semiconductor device according to claim 1, wherein the substrate is light-transparent.

5. A semiconductor device comprising:
a thin film transistor, the thin film transistor comprising:
an island-like semiconductor layer; and
a pair of stripe-like first insulating layers provided below the island-like semiconductor layer over one surface of a substrate,
wherein the pair of stripe-like first insulating layers cross the island-like semiconductor layer.

6. A semiconductor device according to claim 2, wherein a second insulating layer is formed between the island-like semiconductor layer and the stripe-like first insulating layer.

7. A semiconductor device according to claim 5, wherein the pair of the stripe-like first insulating layers are formed of silicon oxide, silicon nitride, or silicon oxide nitride.

8. A semiconductor device according to claim 5, wherein the substrate is light-transparent.

9. A semiconductor device according to claim 5, wherein a gap of the pair of the stripe-like first insulating layers is 2–6 μm.

10. A semiconductor device comprising:
an island-like semiconductor layer; and
a stripe-like first insulating layer provided below the island-like semiconductor layer over one surface of a substrate,
wherein the stripe-like first insulating layer crosses the island-like semiconductor layer, and a channel formation region of a thin film transistor including the island-like semiconductor layer is provided adjacent to the stripe-like first insulating layer.

11. A semiconductor device according to claim 10, wherein a second insulating layer is formed between the island-like semiconductor layer and the stripe-like first insulating layer.

12. A semiconductor device according to claim 10, wherein the stripe-like first insulating layer is formed of silicon oxide, silicon nitride, or silicon oxide nitride.

13. A semiconductor device according to claim 10, wherein the substrate is light-transparent.

14. A semiconductor device comprising:
an island-like semiconductor layer including at least a channel formation region; and
a pair of stripe-like first insulating layers provided below the island-like semiconductor layer over one surface of a substrate,
wherein the channel formation region is provided between the pair of stripe-like first insulating layers.

15. A semiconductor device according to claim 14, wherein a second insulating layer is formed between the island-like semiconductor layer and the stripe-like first insulating layer.

16. A semiconductor device according to claim 14, wherein the pair of the stripe-like first insulating layers are formed of silicon oxide, silicon nitride, or silicon oxide nitride.

17. A semiconductor device according to claim 14, wherein the substrate is light-transparent.

18. A semiconductor device according to claim 14, wherein a gap of the pair of the stripe-like first insulating layers is 2–6 μm.

19. A semiconductor device comprising:
an island-like semiconductor layer; and
a stripe-like first insulating layer provided below the island-like semiconductor layer over one surface of the substrate,
wherein the island-like semiconductor layer forms a channel formation region of a thin film transistor including the island-like semiconductor layer, the stripe-like first insulating layer crosses a channel length direction of the island-like semiconductor layer, and the channel formation region of the thin film transistor including the island-like semiconductor layer is provided adjacent to the stripe-like first insulating layer.

20. A semiconductor device according to claim 19, wherein a second insulating layer is formed between the island-like semiconductor layer and the stripe-like first insulating layer.

21. A semiconductor device according to claim 19, wherein the stripe-like first insulating layer is formed of silicon oxide, silicon nitride, or silicon oxide nitride.

22. A semiconductor device according to claim 19, wherein the substrate is light-transparent.

23. A semiconductor device comprising:
an island-like semiconductor layer; and
a pair of stripe-like first insulating layers provided below the island-like semiconductor layer over one surface of the substrate,
wherein the island-like semiconductor layer forms a channel formation region of a thin film transistor including the island-like semiconductor layer, the pair of stripe-like first insulating layers cross a channel length direction of the island-like semiconductor layer, and the channel formation region of the thin film transistor including the island-like semiconductor layer is provided between the pair of stripe-like first insulating layers.

24. A semiconductor device according to claim 23, wherein a second insulating layer is formed between the island-like semiconductor layer and the stripe-like first insulating layer.

25. A semiconductor device according to claim 23, wherein the pair of stripe-like first insulating layers are formed of silicon oxide, silicon nitride, or silicon oxide nitride.

26. A semiconductor device according to claim 23, wherein the substrate is light-transparent.

27. A semiconductor device according to claim 23, wherein a gap of the pair of the stripe-like first insulating layers is 2–6 µm.

28. An EL display device comprising:
a thin film transistor, the thin film transistor comprising:
an island-like semiconductor layer;
a stripe-like first insulating layer provided below the island-like semiconductor layer over one surface of a substrate; and
a light emitting layer provided over the island-like semiconductor layer,
wherein the stripe-like first insulating layer crosses the island-like semiconductor layer.

29. An EL display device according to claim 28, wherein a second insulating layer is formed between the island-like semiconductor layer and the stripe-like first insulating layer.

30. An El display device according to claim 28, wherein the stripe-like first insulating layer is formed of silicon oxide, silicon nitride, or silicon oxide nitride.

31. An EL display device according to claim 28, wherein the substrate is light transparent.

32. An EL display device comprising:
a thin film transistor, the thin film transistor comprising:
an island-like semiconductor layer; and
a pair of stripe-like first insulating layers provided below the island-like semiconductor layer over one surface of a substrate; and
a light emitting layer provided over the island-like semiconductor layer,
wherein the pair of stripe-like first insulating layers cross the island-like semiconductor layer.

33. An EL display device according to claim 32, wherein a second insulating layer is formed between the island-like semiconductor layer and the stripe-like first insulating layer.

34. An El display device according to claim 32, wherein the pair of stripe-like first insulating layers are formed of silicon oxide, silicon nitride, or silicon oxide nitride.

35. An EL display device according to claim 32, wherein the substrate is light transparent.

36. An EL display device according to claim 32, wherein a gap of the pair of the stripe like first insulating layers is 2–6 µm.

37. An EL display device comprising:
an island-like semiconductor layer;
a stripe-like first insulating layer provided below the island-like semiconductor layer over one surface of a substrate; and
a light emitting layer provided over said island-like semiconductor layer,
wherein the stripe-like first insulating layer crosses the island-like semiconductor layer, and a channel formation region of a thin film transistor including the island-like semiconductor layer is provided adjacent to the stripe-like first insulating layer.

38. An EL display device according to claim 37, wherein a second insulating layer is formed between the island-like semiconductor layer and the stripe-like first insulating layer.

39. An El display device according to claim 37, wherein the stripe-like first insulating layer is formed of silicon oxide, silicon nitride, or silicon oxide nitride.

40. An EL display device according to claim 37, wherein the substrate is light transparent.

41. An EL display device comprising:
an island-like semiconductor layer including at least a channel formation region;
a pair of stripe-like first insulating layers provided adjacent the island-like semiconductor layer over one surface of a substrate; and
a light emitting layer provided over the island-like semiconductor layer,
wherein the channel formation region is provided between the pair of stripe-like first insulating layers.

42. An EL display device according to claim 41 wherein a second insulating layer is formed between the island-like semiconductor layer and the stripe-like first insulating layer.

43. An El display device according to claim 41, wherein the pair of stripe-like first insulating layers are formed of silicon oxide, silicon nitride, or silicon oxide nitride.

44. An EL display device according to claim 41, wherein the substrate is light transparent.

45. An EL display device according to claim 41, wherein a gap of the pair of the stripe like first insulating layers is 2–6 µm.

46. An EL display device comprising:
an island-like semiconductor layer;
a stripe-like first insulating layer provided below the island-like semiconductor layer over one surface of a substrate; and
a light emitting layer provided over the island-like semiconductor layer,
wherein the island-like semiconductor layer forms a channel formation region of a thin film transistor including the island-like semiconductor layer, the stripe-like first insulating layer crosses a channel length direction of the island-like semiconductor layer, and the channel formation region of the thin film transistor including the island-like semiconductor layer is provided adjacent to stripe-like first insulating layer.

47. An EL display device according to claim 46, wherein a second insulating layer is formed between the island-like semiconductor layer and the stripe-like first insulating layer.

48. An El display device according to claim 46, wherein the stripe-like first insulating layer is formed of silicon oxide, silicon nitride, or silicon oxide nitride.

49. An EL display device according to claim 46, wherein the substrate is light transparent.

50. An EL display device comprising:
an island-like semiconductor layer;
a pair of stripe-like first insulating layers provided below the island-like semiconductor layer on one surface of the substrate; and
a light emitting layer provided over the island-like semiconductor layer,
wherein the island-like semiconductor layer forms a channel formation region of a thin film transistor including the island-like semiconductor layer, the pair of stripe-like first insulating layers cross a channel length direction of the island-like semiconductor layer, and the channel formation region of the thin film transistor including the island-like semiconductor layer is provided between the pair of stripe-like first insulating layers.

51. An EL display device according to claim 50, wherein a second insulating layer is formed between the island-like semiconductor layer and the stripe-like first insulating layer.

52. An El display device according to claim 50, wherein the pair of stripe-like first insulating layers are formed of silicon oxide, silicon nitride, or silicon oxide nitride.

53. An EL display device according to claim 50, wherein the substrate is light transparent.

54. An EL display device according to claim 50, wherein a gap of the pair of the stripe like first insulating layers is 2–6 µm.

55. An EL display device comprising:

an island-like semiconductor layer;

a stripe-like first insulating layer provided below the island-like semiconductor layer over one surface of a substrate; and a first electrode made of a conductive film with reflectivity provided over the island like semiconductor layer;

a light emitting layer provided over the first electrode;

a second electrode made of a transparent conductive film provided over the light emitting layer, wherein the stripe like first insulating layer crosses the island-like semiconductor layer is provided adjacent to the stripe-like first insulating layer.

56. An EL display device according to claim 55, wherein a second insulating layer is formed between the island-like semiconductor layer and the stripe-like first insulating layer.

57. An El display device according to claim 55, wherein the stripe-like first insulating layer is formed of silicon oxide, silicon nitride, or silicon oxide nitride.

58. An EL display device according to claim 55, wherein the substrate is light transparent.

* * * * *